United States Patent
Sato

(10) Patent No.: US 11,527,666 B2
(45) Date of Patent: Dec. 13, 2022

(54) COMPOUND-SEMICONDUCTOR PHOTOVOLTAIC CELL AND MANUFACTURING METHOD OF COMPOUND-SEMICONDUCTOR PHOTOVOLTAIC CELL

(71) Applicant: RICOH COMPANY, LTD., Tokyo (JP)

(72) Inventor: Shunichi Sato, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 453 days.

(21) Appl. No.: 15/309,067

(22) PCT Filed: Jul. 8, 2015

(86) PCT No.: PCT/JP2015/003451
§ 371 (c)(1),
(2) Date: Nov. 4, 2016

(87) PCT Pub. No.: WO2016/006247
PCT Pub. Date: Jan. 14, 2016

(65) Prior Publication Data
US 2017/0077340 A1   Mar. 16, 2017

(30) Foreign Application Priority Data

Jul. 11, 2014 (JP) .............................. JP2014-142826
Jun. 17, 2015 (JP) .............................. JP2015-122272

(51) Int. Cl.
*H01L 31/0687* (2012.01)
*H01L 31/0693* (2012.01)
(Continued)

(52) U.S. Cl.
CPC .... *H01L 31/0687* (2013.01); *H01L 31/03046* (2013.01); *H01L 31/0693* (2013.01);
(Continued)

(58) Field of Classification Search
CPC ............. H01L 31/0687; H01L 31/1892; H01L 31/03046; H01L 31/06875; H01L 31/0693;
(Continued)

(56) References Cited

U.S. PATENT DOCUMENTS 6,660,928 B1 * 12/2003 Patton ................. H01L 31/0687
136/249
8,933,326 B2   1/2015 Sasaki et al.
(Continued)

FOREIGN PATENT DOCUMENTS

DE   10-2012-004734 A1   9/2013
JP   H09-064386           3/1997
(Continued)

OTHER PUBLICATIONS

NSM "NSM Archive—Basic Parameters of Gallium Indium Phosphide (GaInP)" http://www.ioffe.ru/SVA/NSM/Semicond/GaInP/basic.html (Year: 2011).*
(Continued)

*Primary Examiner* — Michael Y Sun
(74) *Attorney, Agent, or Firm* — Xsensus LLP

(57) ABSTRACT

A compound-semiconductor photovoltaic cell includes a first photoelectric conversion cell made of a first compound-semiconductor material which lattice matches with GaAs or Ge; a first tunnel junction layer arranged on a deep side farther than the first photoelectric conversion cell in a light incident direction, and including a first p-type $(Al_{x1}Ga_{1-x1})_{y1}In_{1-y1}As$ ($0 \le x1 < 1$, $0 < y1 \le 1$) layer and a first n-type $(Al_{x2}Ga_{1-x2})_{y2}In_{1-y2}P$ ($0 \le x2 < 1$, $0 < y2 < 1$) layer; and a second photoelectric conversion cell arranged on a deep side farther than the first tunnel junction layer in the light incident direction, and made of a second compound-semiconductor material which is a GaAs-based semiconductor material.

(Continued)

The first photoelectric conversion cell and the second photoelectric conversion cell are joined via the first tunnel junction layer, and a lattice constant of the first n-type $(Al_{x2}Ga_{1-x2})_{y2}In_{1-y2}P$ layer is greater than a lattice constant of the first photoelectric conversion cell.

16 Claims, 17 Drawing Sheets

(51) Int. Cl.
*H01L 31/0304* (2006.01)
*H01L 31/18* (2006.01)
H01L 27/30 (2006.01)
H01L 31/0725 (2012.01)
H01L 21/02 (2006.01)

(52) U.S. Cl.
CPC .... *H01L 31/06875* (2013.01); *H01L 31/1892* (2013.01); *H01L 21/02304* (2013.01); *H01L 27/301* (2013.01); *H01L 31/0725* (2013.01); *Y02E 10/544* (2013.01); *Y02P 70/50* (2015.11)

(58) Field of Classification Search
CPC ............. H01L 21/02304; H01L 27/301; H01L 31/0725; Y02P 70/521; Y02P 70/50; Y02E 10/544
See application file for complete search history.

(56) References Cited

U.S. PATENT DOCUMENTS

| | | | |
|---|---|---|---|
| 2010/0229930 A1* | 9/2010 | Fetzer | H01L 31/0687 136/255 |
| 2010/0282306 A1* | 11/2010 | Sharps | H01L 31/0687 136/255 |
| 2012/0125392 A1 | 5/2012 | Woo et al. | |
| 2012/0138130 A1 | 6/2012 | Guter et al. | |
| 2012/0240987 A1 | 9/2012 | King et al. | |
| 2013/0118546 A1* | 5/2013 | Jones-Albertus | H01L 31/06 136/244 |
| 2015/0034153 A1 | 2/2015 | Sato et al. | |
| 2015/0053257 A1 | 2/2015 | Dimroth et al. | |
| 2015/0333214 A1 | 11/2015 | Sato et al. | |
| 2016/0343898 A1 | 11/2016 | Sato et al. | |

FOREIGN PATENT DOCUMENTS

| | | |
|---|---|---|
| JP | 2001-102608 | 4/2001 |
| JP | 2011-077295 | 4/2011 |
| JP | 2011-134952 | 7/2011 |
| JP | 2013-115415 | 6/2013 |
| JP | 2013-543278 | 11/2013 |
| JP | 2014-123712 | 7/2014 |
| WO | 2014/081048 | 5/2014 |

OTHER PUBLICATIONS

NSM "http://www.ioffe.ru/SVA/NSM/Semicond/AlGaAs/basic.html" (Year: 2019).*
Yong-gang Zhang "Al(Ga)InP—GaAs Photodiodes Tailored for Specific Wavelength Range" http://dx.doi.org/10.5772/50404 (Year: 2012).*
Batop Optoelectronics "Energy band gap Eg of AlGaAs alloys" https://www.batop.de/information/Eg_AlGaAs.html (Year: 2021).*
S. G. Choi "Optical properties of AlxGa1—xP (0<x<0.52 alloys)" Journal of Applied Physics 87, 1287 (2000); (Year: 2000).*
International Search Report dated Aug. 11, 2015 in PCT/JP2015/003451 filed on Jul. 8, 2015.
Tatsuya Takamoto et al., "World's Highest Efficiency Triple-Junction Solar Cells Fabricated by Inverted Layers Transfer Process", Proceedings of the 29th IEEE Photovoltaic Specialists Conference (2010) pp. 412-417.
B. E. Sağol et al., "Lifetime and Performance of InGaAsP and InGaAs Absorbers for Low Bandgap Tandem Solar Cells", Proceedings of the 28th IEEE Photovoltaic Specialists Conference (2009) pp. 1090-1093.
Masakazu Sugiyama et al., "High-efficiency quantum structure tandem solar cells", Oyo Butsuri vol. 79 No. 5 pp. 435-439 (2010), The Japan Society of Applied Physics.
European search report dated Jun. 23, 2017 in connection with corresponding European patent application No. 15819204.7.
Guter W. et al. "Current-matched triple-junction solar cell reaching 41.1% conversion efficiency under concentrated sunlight", Appl. Phys. Lett. 2009 (94) 223504.
Office Action dated Jul. 10, 2019 in European Patent Application No. 15 819 204.7, 8 pages.
Samberg, J. P. et al. "Effect of GaAs interfacial layer on the performance of high bandgap tunnel junctions for multijunction solar cells", Applied Physics Letters, XP012174832, vol. 103, No. 10, Sep. 2, 2013, pp. 103503.1-103503-4.

* cited by examiner

[Fig. 1]
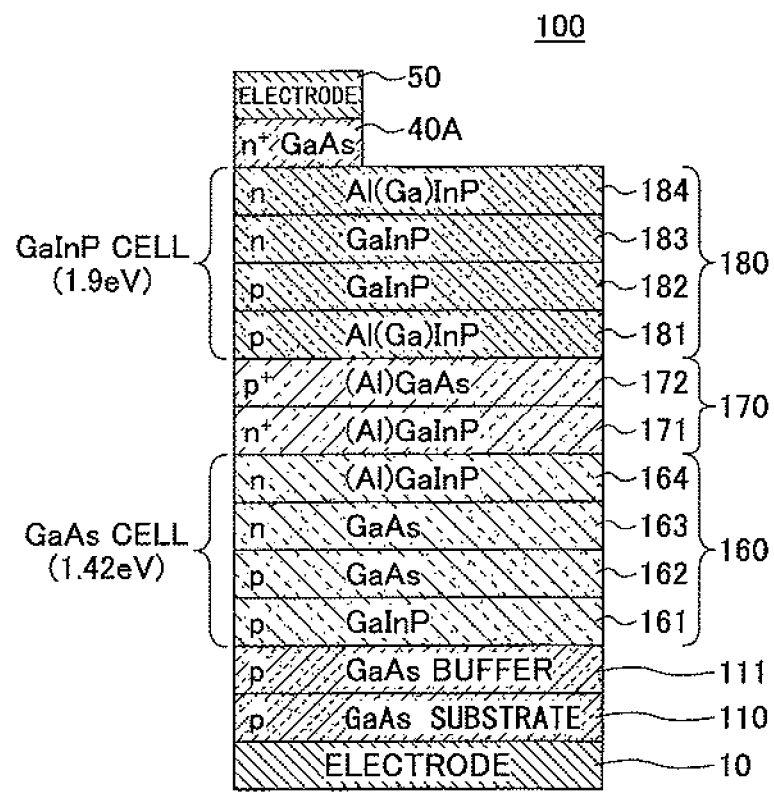
[Fig. 2A]
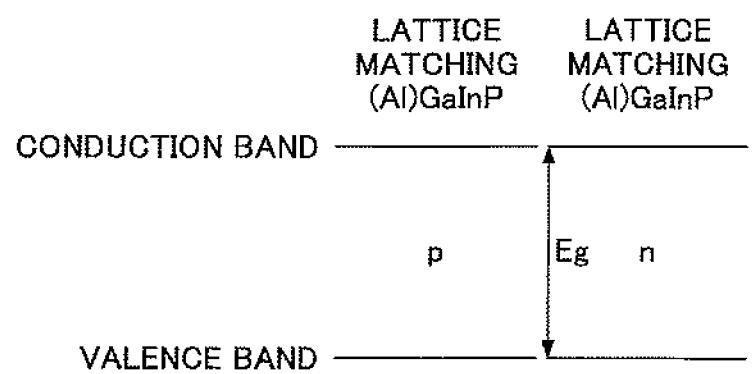

[Fig. 2B]
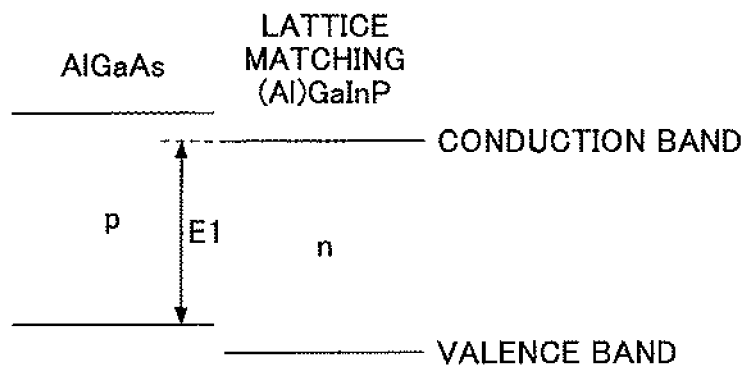
[Fig. 2C]
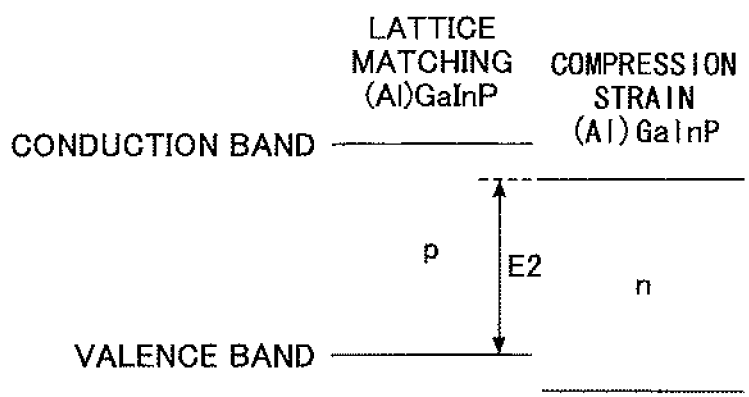
[Fig. 2D]
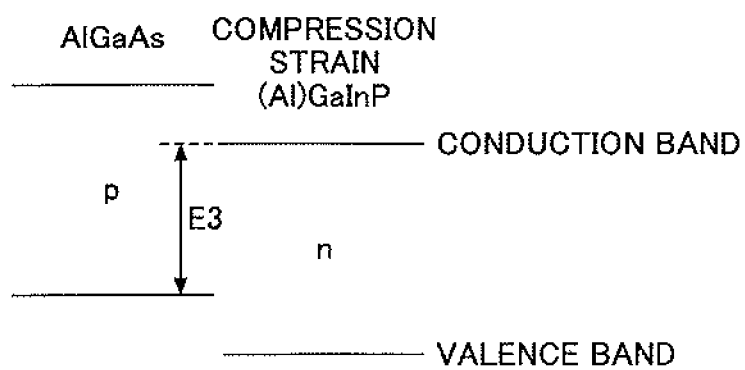

[Fig. 3]
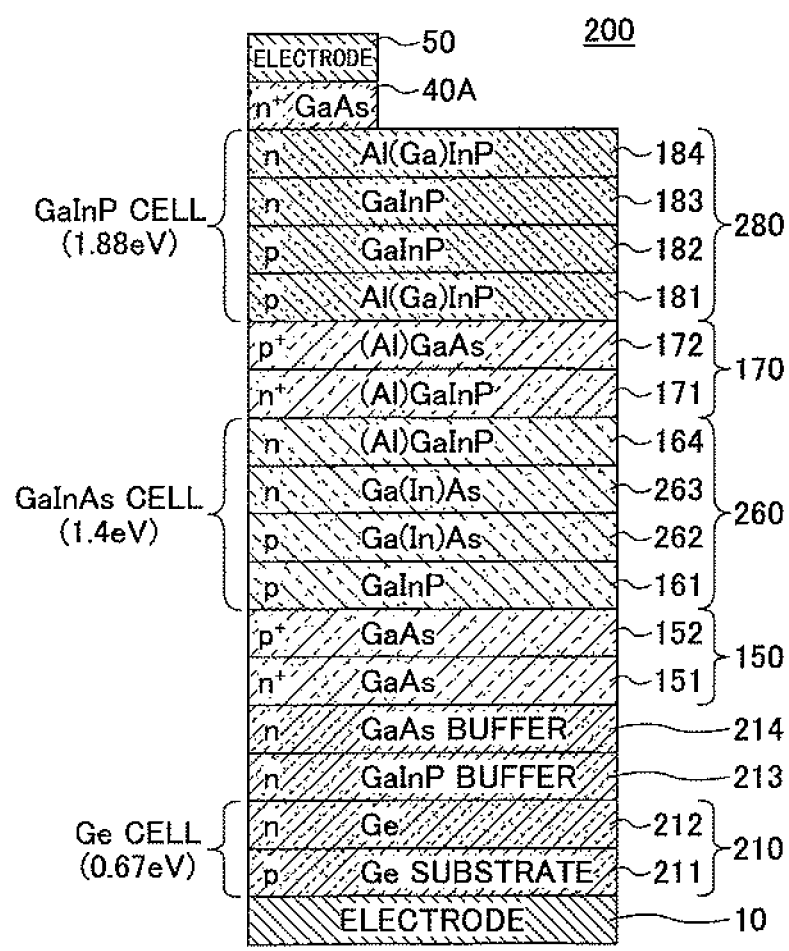

[Fig. 4]
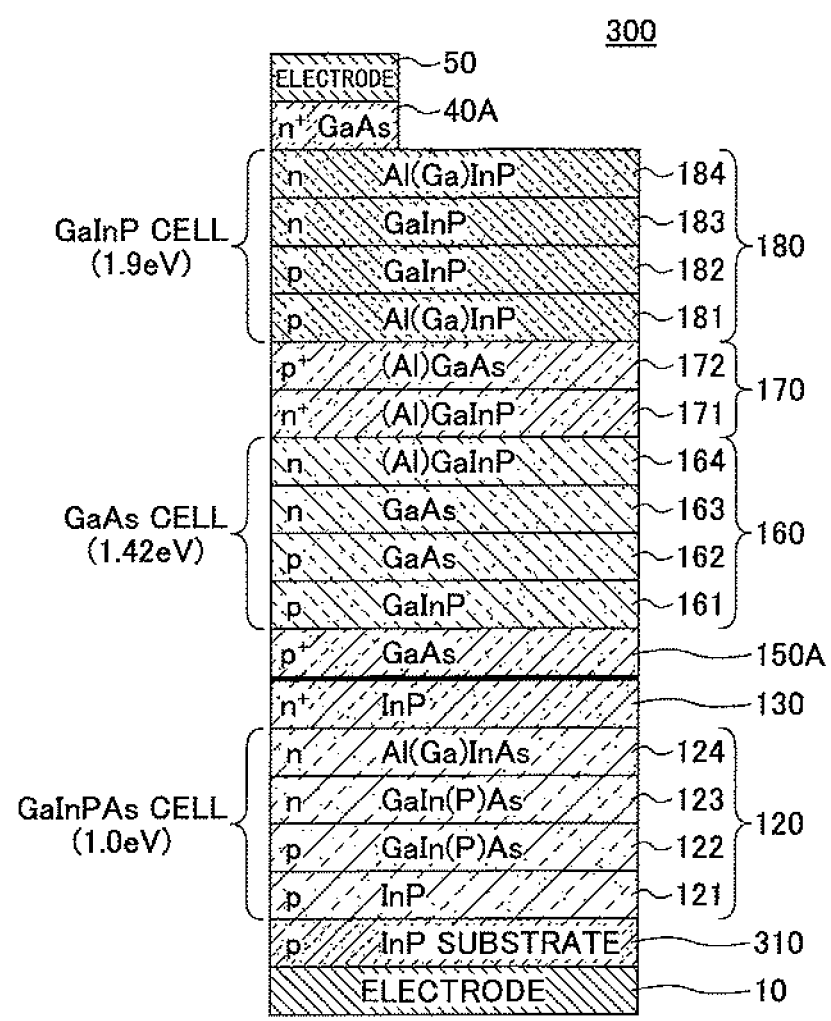

[Fig. 5A]
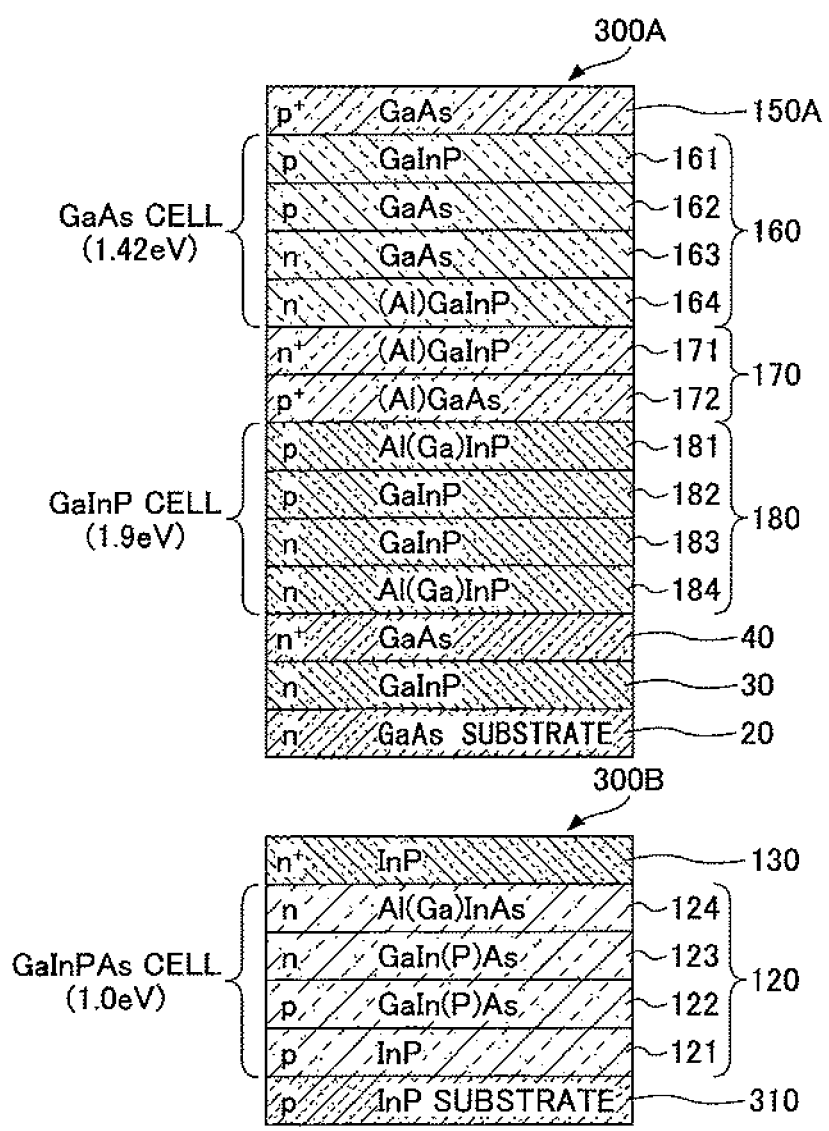

[Fig. 5B]
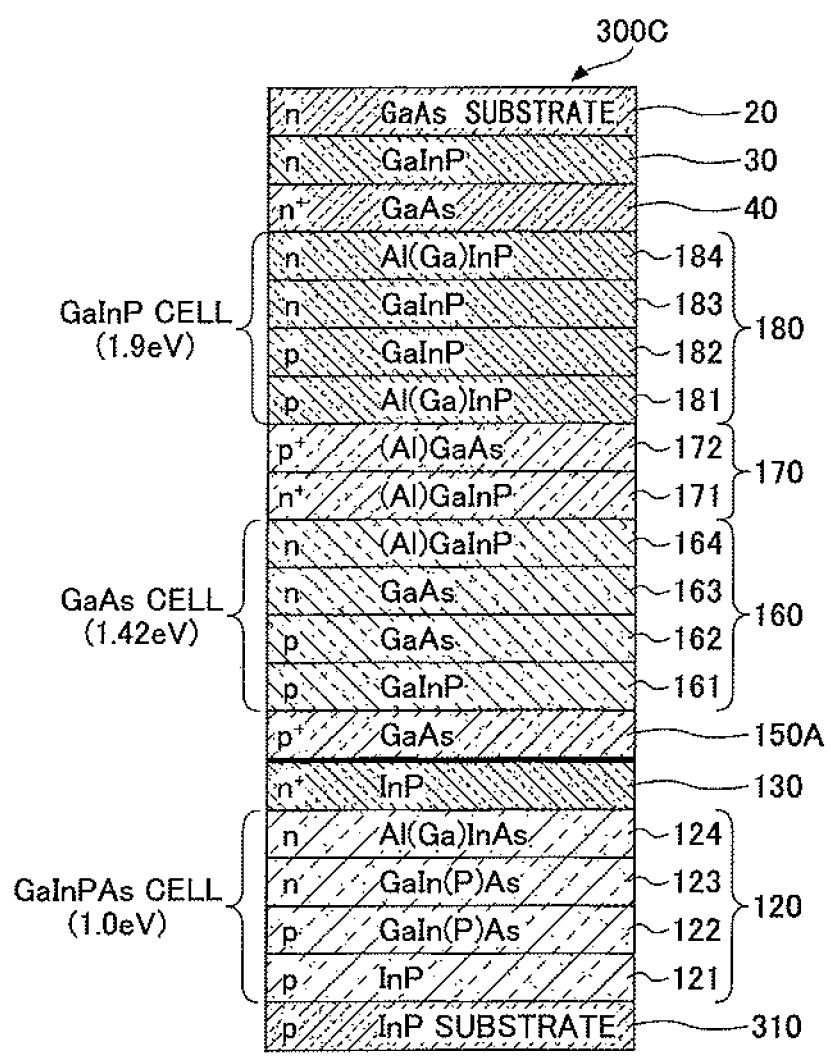

[Fig. 6A]
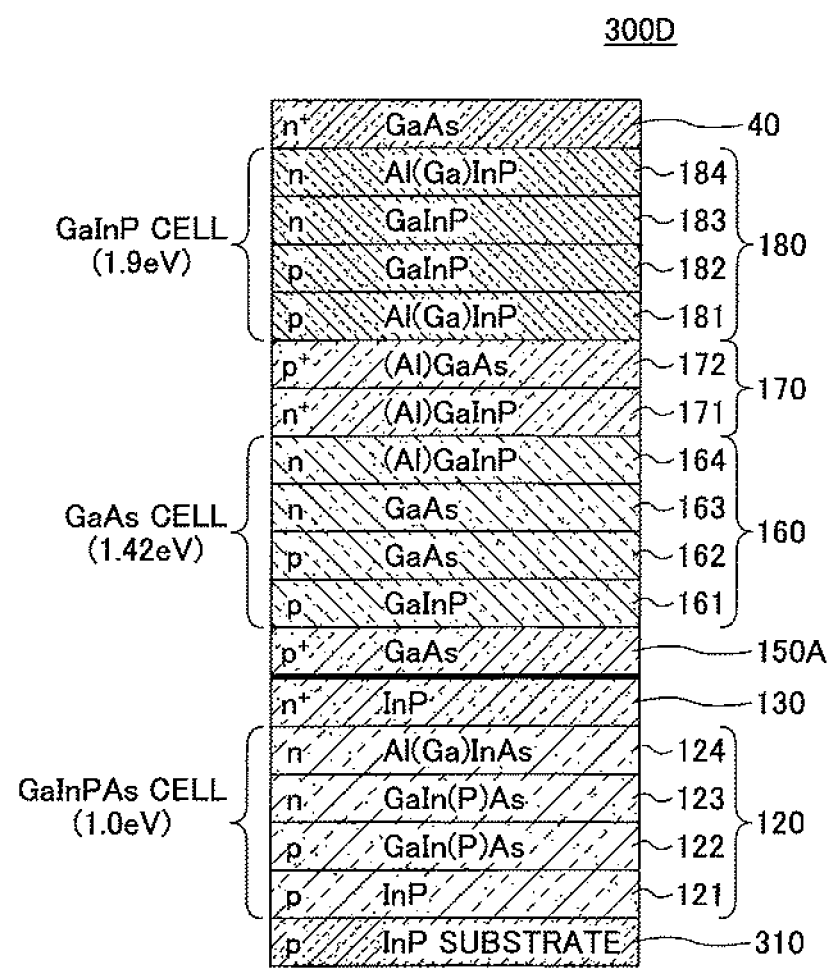

[Fig. 6B]
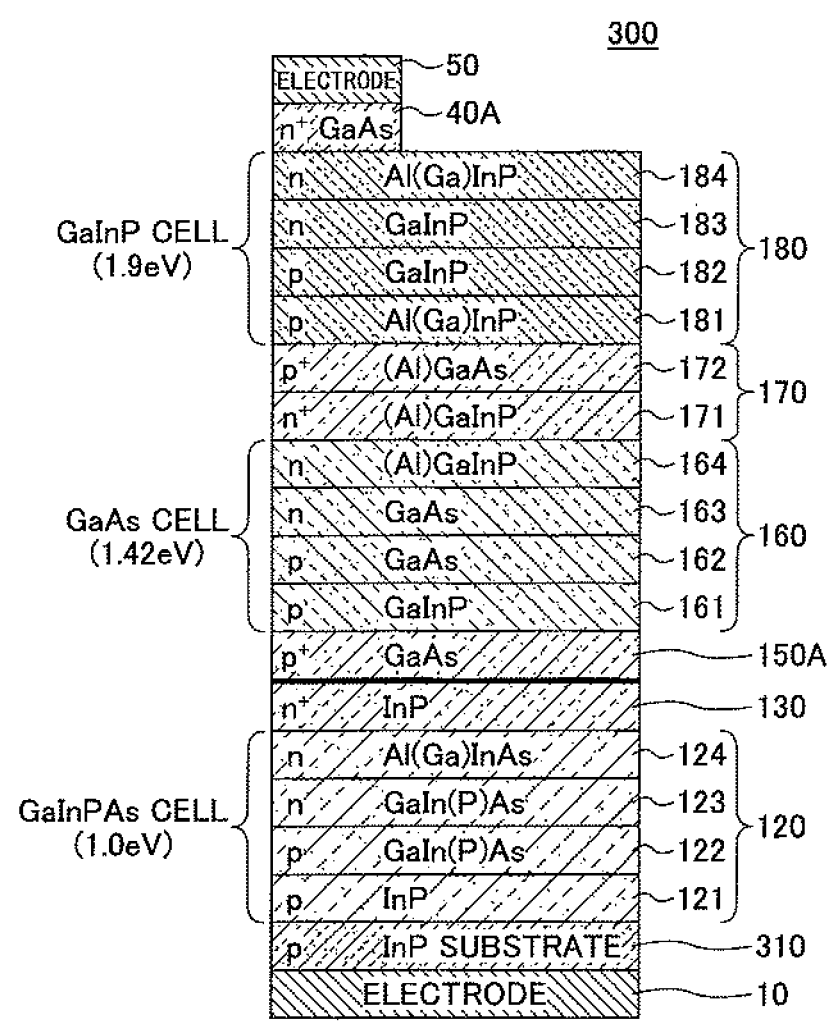

[Fig. 7]
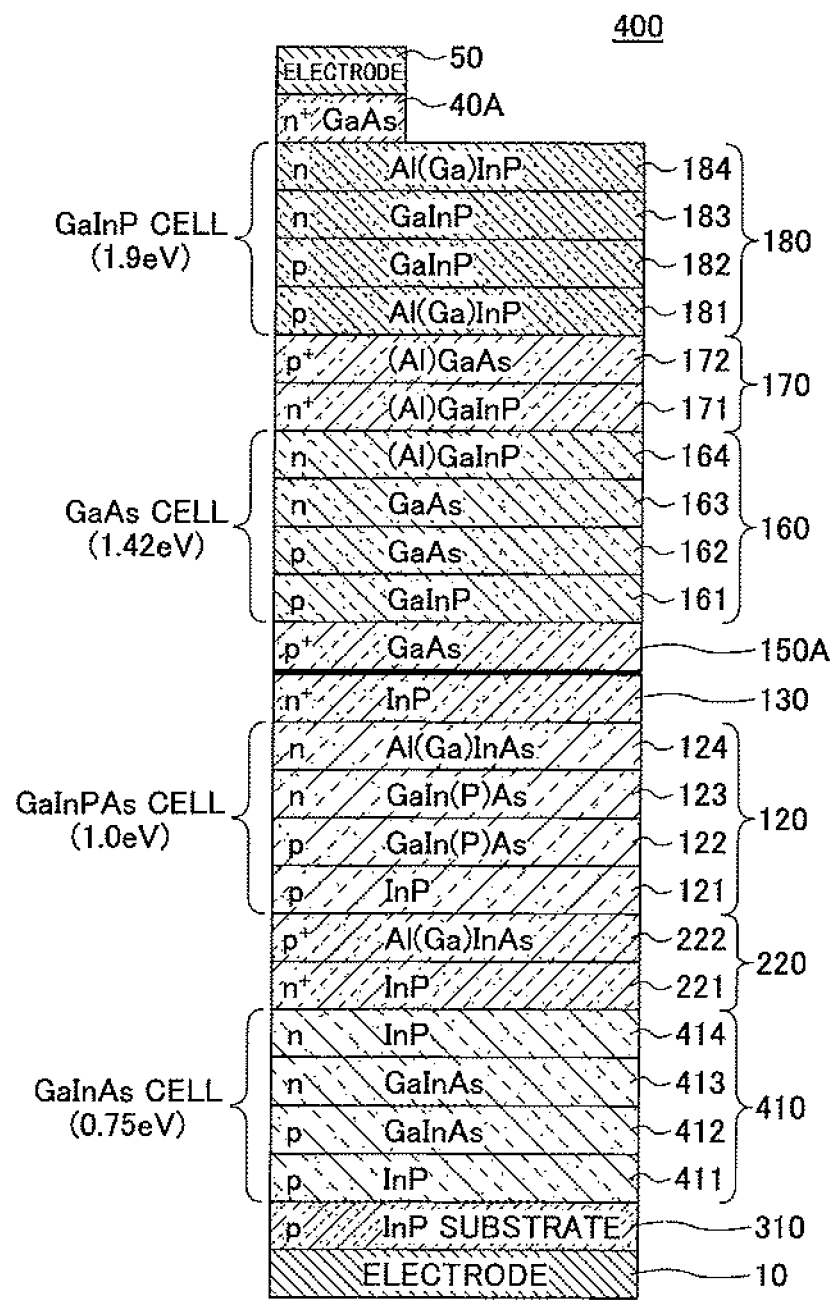

[Fig. 8]
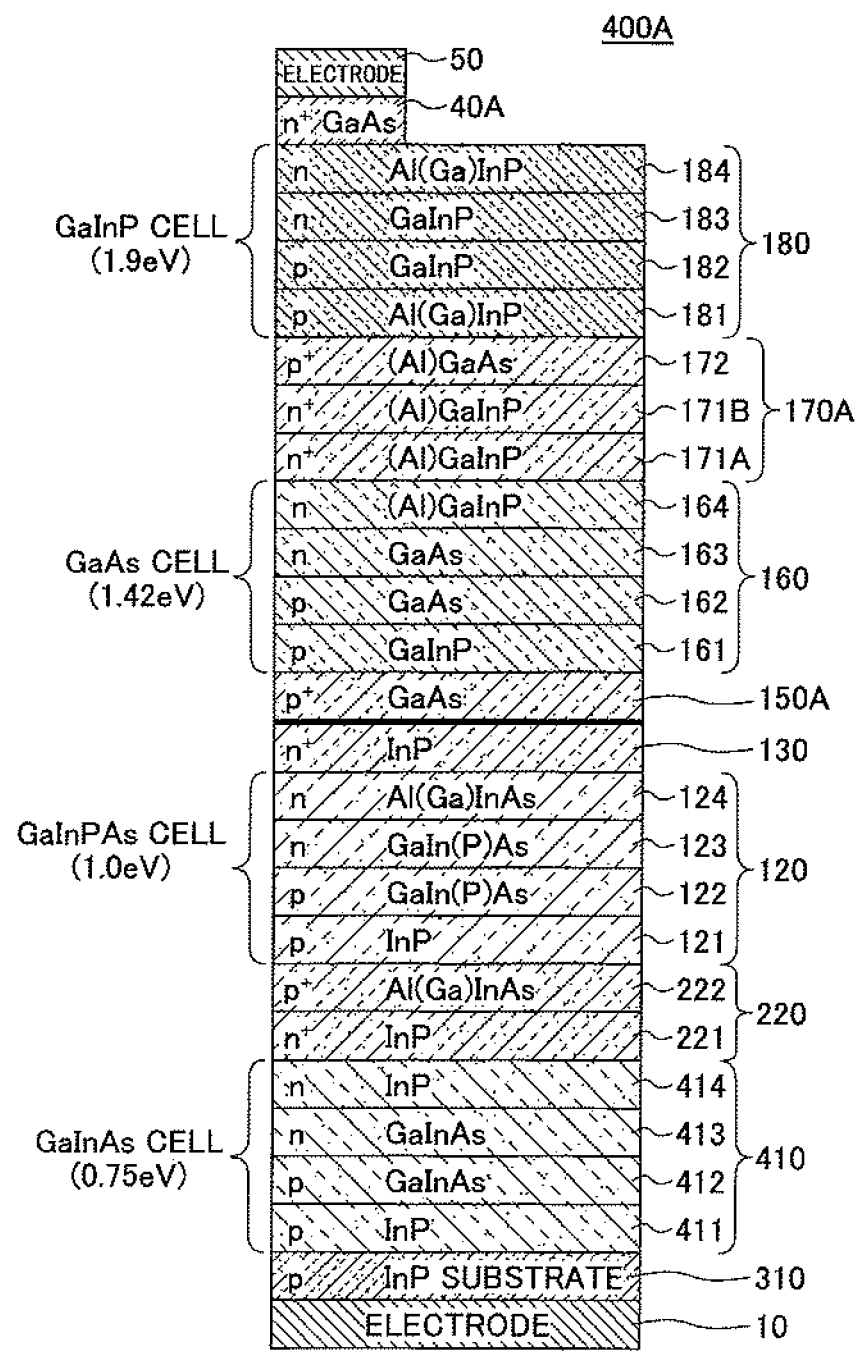

[Fig. 9]
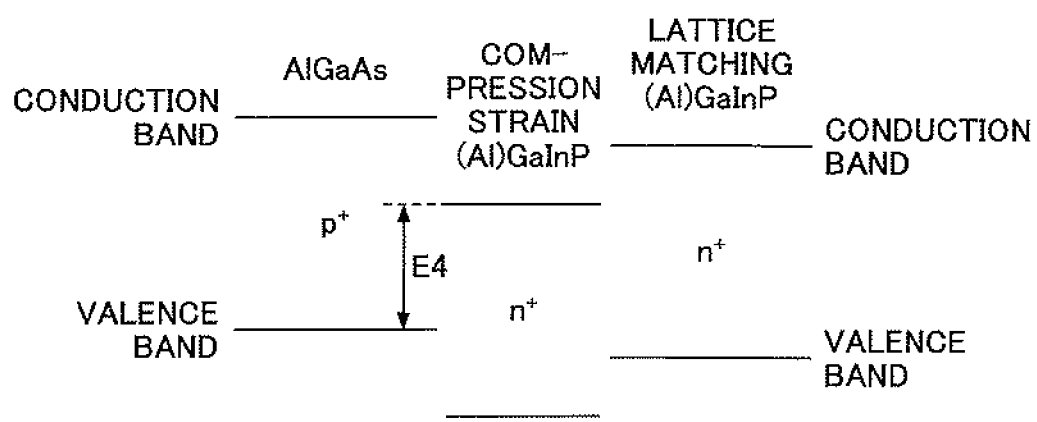

[Fig. 10]
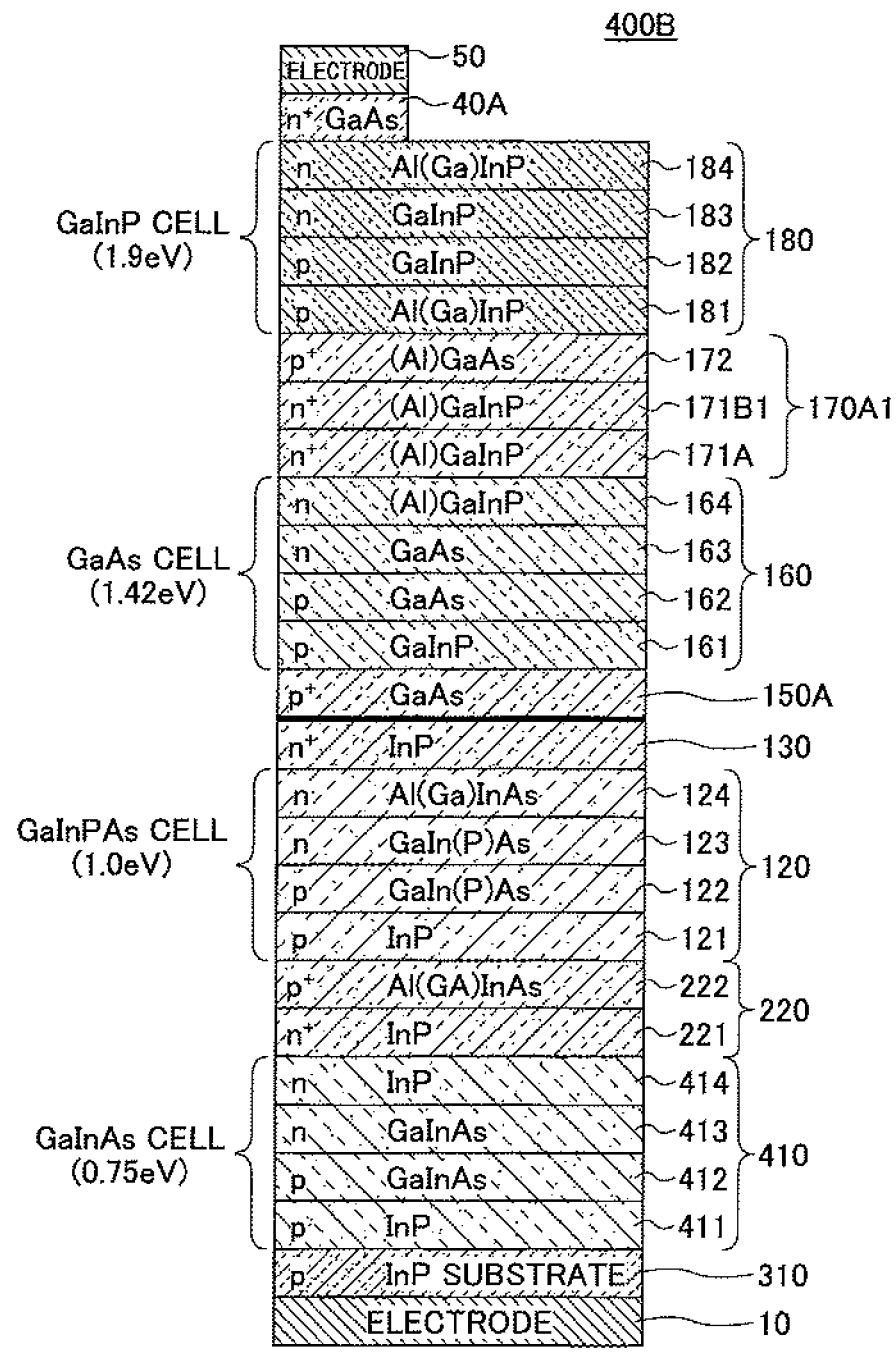

[Fig. 11]
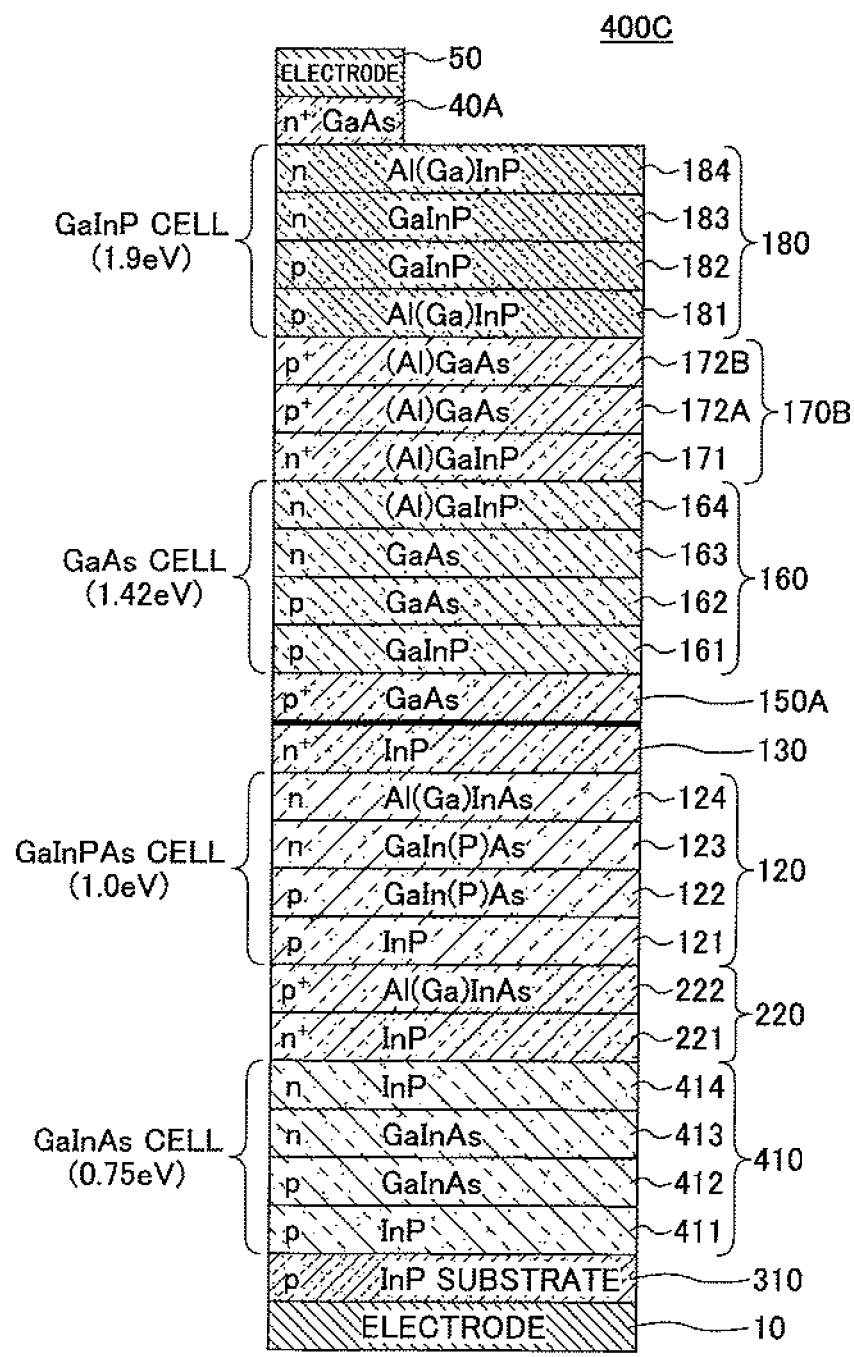

[Fig. 12]
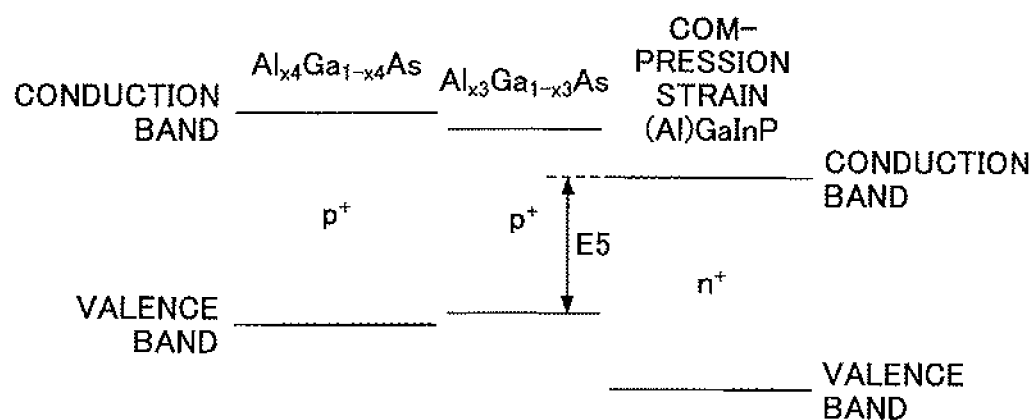

[Fig. 13]
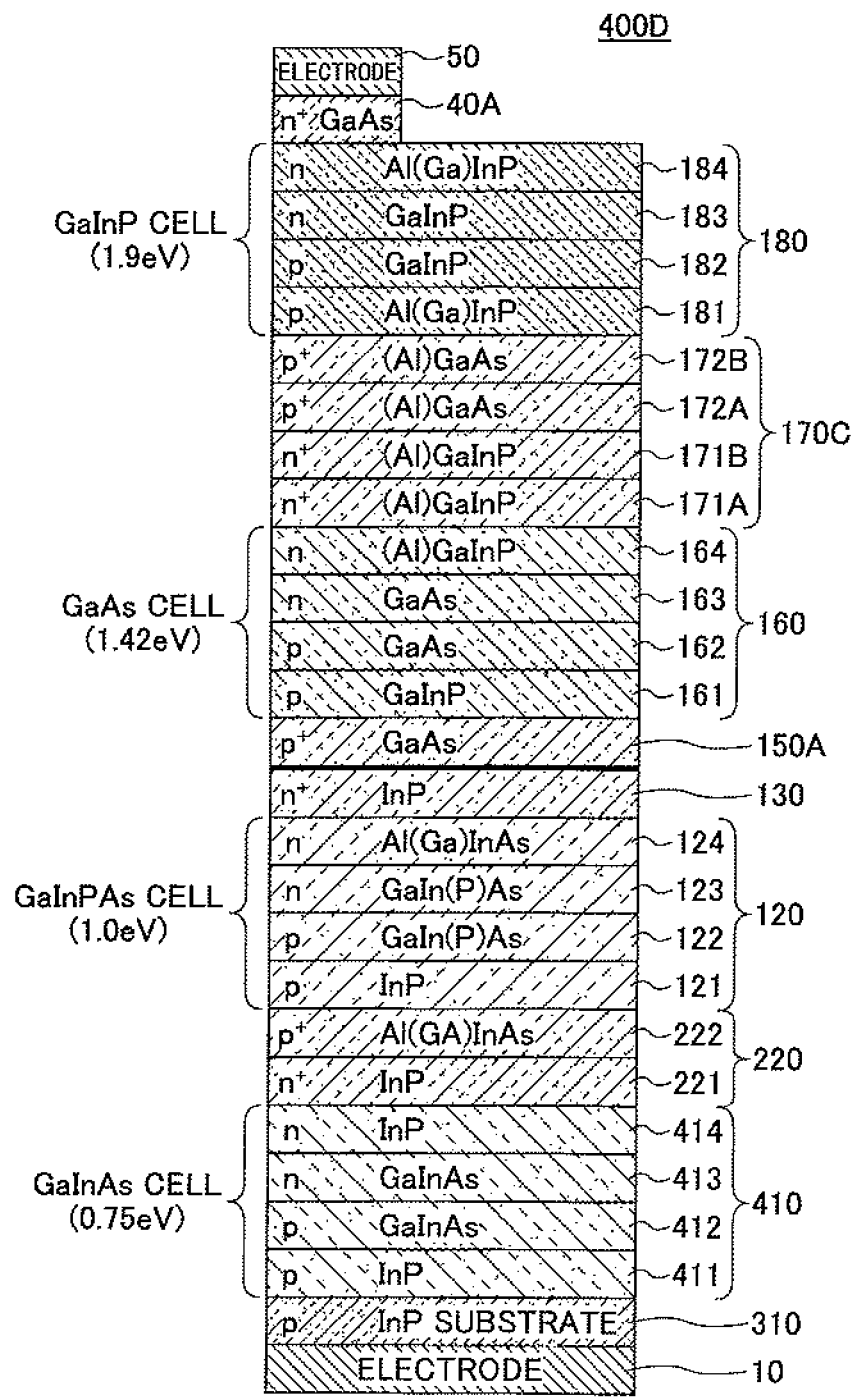

[Fig. 14]
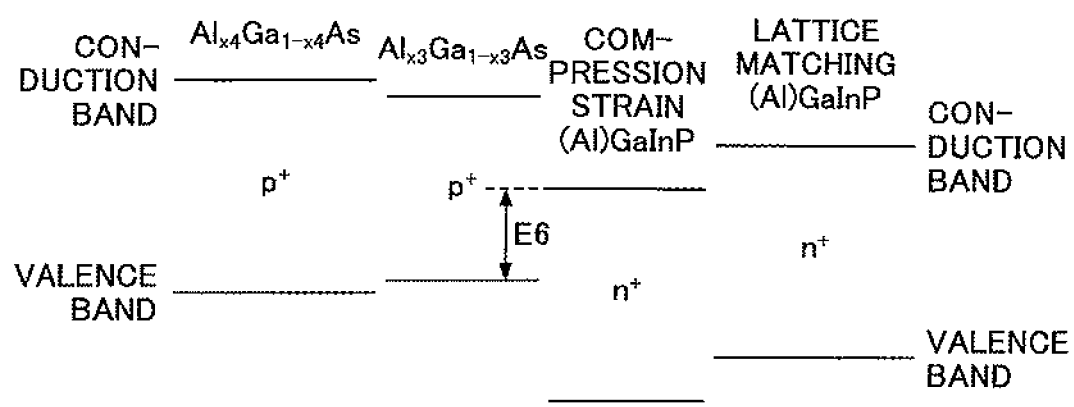

[Fig. 15]
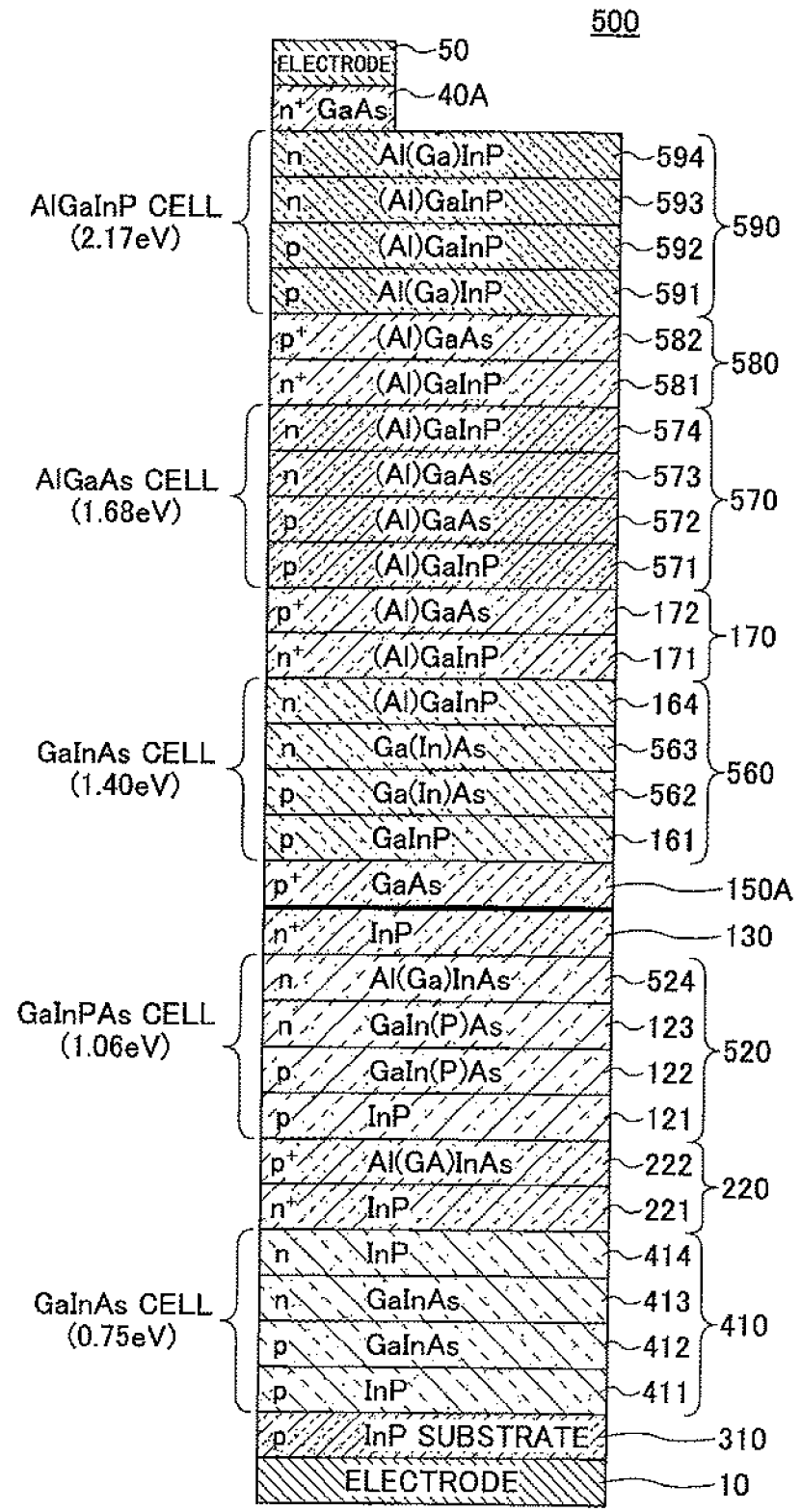

COMPOUND-SEMICONDUCTOR PHOTOVOLTAIC CELL AND MANUFACTURING METHOD OF COMPOUND-SEMICONDUCTOR PHOTOVOLTAIC CELL

TECHNICAL FIELD

The disclosure herein generally relates to a compound-semiconductor photovoltaic cell and a manufacturing method of a compound-semiconductor photovoltaic cell.

BACKGROUND ART

Conventionally, there have been compound-semiconductor photovoltaic cells, each including a germanium (Ge) substrate, a bottom cell arranged on the substrate and a first impurity confinement layer, which is arranged in an upper part of the bottom cell and includes a first conduction type aluminum indium phosphide ($Al_y In_{1-y} P$) layer having a composition y lattice matching with the substrate. The photovoltaic cell further includes a first high impurity density layer, which is arranged on the first impurity confinement layer and includes a first conduction type indium gallium phosphide ($In_x Ga_{1-x} P$) layer having a composition x lattice matching with the substrate, and a second high impurity density layer, which has the composition x and includes a second conduction type $In_x Ga_{1-x} P$ layer arranged on the first high impurity density layer so as to form a tunnel junction along with the first high impurity density layer. The second conduction type is a conduction type opposite to the first conduction type. The photovoltaic cell further includes a second impurity confinement layer, which is arranged on the second high impurity density layer and includes the second conduction type aluminum gallium phosphide ($Al_y Ga_{1-y} P$) layer having the composition y, and a top cell arranged on the second impurity layer (See, for example, Patent Document 1).

Moreover, there have been triple-junction photovoltaic cells in which band gaps for respective cells are set to 1.9 eV/1.42 eV/1.0 eV (See, for example, Non-Patent Document 1).

Non-Patent Document 2 discloses a low band gap tandem solar cell based on low band gap absorber materials InGaAsP (1.03 eV) and InGaAs (0.73 eV). Furthermore, Non-Patent Document 2 discloses using time resolved photoluminescence measurements to evaluate service lifetimes of the low band gap absorber materials.

CITATION LIST

Patent Literature

PTL 1: Japanese Published Patent Application No. 2001-102608

Non Patent Literature

NPL 1: Proceedings of the 29st IEEE Photovoltaic Specialists Conference (2010) pp. 412-417
NPL 2: Non-Patent Document 2: Proceedings of the 28th IEEE Photovoltaic Specialists Conference (2009) pp. 1090-1093

SUMMARY OF INVENTION

Technical Problem

Patent document 1 describes a tunnel junction between a $p^+$-GaInP (gallium indium phosphide) layer and an $n^+$-GaInP layer in a conventional double-junction type photovoltaic cell. This tunnel junction is a homo junction.

Since an energy difference between a valence band of a p-type layer and a conduction band of an n-type layer in the homo junction is greater than an energy difference between a valence band of a p-type layer and a conduction band of an n-type layer in a type II of a hetero junction, enhancement of efficiency in the tunnel junction disclosed in Patent Document 1 is insufficient.

Moreover, between a GaInP sub photovoltaic cell and a GaInAs (gallium indium arsenide) sub photovoltaic cell in Non-Patent Document 1, a tunnel junction between a $p^+$-AlGaAs (aluminum gallium arsenide) layer and an $n^+$-GaInP layer is formed. However, details of the $p^+$-AlGaAs layer and the $n^+$-GaInP layer are not described, and enhancement of efficiency including the tunnel junction is not performed.

Non-Patent Document 2 does not describe realizing a combination of band gaps by using a lattice constant.

As described above, enhancement of efficiency for the conventional photovoltaic cell of compound semiconductor has not been performed sufficiently.

In view of the above subject matter, it is a general object of at least one embodiment of the present invention to provide a compound-semiconductor photovoltaic cell and a manufacturing method of the compound-semiconductor photovoltaic cell, efficiency of which is enhanced.

Solution to Problem

According to an aspect of the invention, a compound-semiconductor photovoltaic cell includes a first photoelectric conversion cell made of a first compound-semiconductor material which lattice matches with gallium arsenide (GaAs) or germanium (Ge); a first tunnel junction layer arranged on a deep side farther than the first photoelectric conversion cell in a light incident direction, and including a first positive type (p-type) aluminum gallium indium arsenide (($Al_{x1} Ga_{1-x1})_{y1} In_{1-y1}$As ($0 \leq x1 < 1$, $0 < y1 \leq 1$)) layer and a first negative type (n-type) aluminum gallium indium phosphide (($Al_{x2} Ga_{1-x2})_{y2} In_{1-y2}$P ($0 \leq x2 < 1$, $0 < y2 < 1$)) layer; and a second photoelectric conversion cell arranged on a deep side farther than the first tunnel junction layer in the light incident direction, and made of a second compound-semiconductor material which is a GaAs-based semiconductor material. The first photoelectric conversion cell and the second photoelectric conversion cell are joined via the first tunnel junction layer. A lattice constant of the first n-type ($Al_{x2} Ga_{1-x2})_{y2} In_{1-y2}$P layer is greater than a lattice constant of the first photoelectric conversion cell.

According to another aspect of the invention, a manufacturing method of a compound-semiconductor photovoltaic cell, which has a first photoelectric conversion cell made of a first compound-semiconductor material and a second photoelectric conversion cell made of a second compound-semiconductor material, includes a step of laminating the second photoelectric conversion cell on a compound-semiconductor substrate; a step of laminating a tunnel junction layer, which includes a p-type ($Al_{x1} Ga_{1-x1})_{y1} In_{1-y1}$As ($0 \leq x1 < 1$, $0 < y1 \leq 1$) layer and an n-type ($Al_{x2} Ga_{1-x2})_{y2} In_{1-y2}$P ($0 \leq x2 < 1$, $0 < y2 < 1$) layer, on the second photoelectric conversion cell; and a step of laminating the first photoelectric conversion cell on the tunnel junction layer. The first compound-semiconductor material is a compound-semiconductor material lattice matching with GaAs or Ge. The second compound-semiconductor material is a GaAs-based compound-semiconductor material. A lattice constant of the n-type $(Al_{x2}Ga_{1-x2})_{y2}In_{1-y2}P$ layer is greater than a lattice constant of the first photoelectric conversion cell.

According to yet another aspect of the invention, a manufacturing method of a compound semiconductor photovoltaic cell includes a step of laminating, on a first compound-semiconductor substrate, a first photoelectric conversion cell made of a first compound-semiconductor material which lattice matches with GaAs or Ge; a step of laminating, on the first photoelectric conversion cell, a first tunnel junction layer, which includes a first p-type $(Al_{x1}Ga_{1-x1})_{y1}In_{1-y1}As$ ($0 \leq x1 < 1$, $0 < y1 \leq 1$) layer and a first n-type $(Al_{x2}Ga_{1-x2})_{y2}In_{1-y2}P$ ($0 \leq x2 < 1$, $0 < y2 < 1$) layer; a step of laminating, on the first tunnel junction layer, a second photoelectric conversion cell made of a second compound-semiconductor material which is a GaAs-based semiconductor material; a step of laminating, on the second photoelectric conversion cell, a first junction layer made of a third compound-semiconductor material; a step of laminating, on a second compound-semiconductor substrate, one or more third photoelectric conversion cells, each made of a fourth compound-semiconductor material; a step of laminating, on the one or more third photoelectric conversion cells, a second junction layer made of a fifth compound-semiconductor material; a step of joining a surface of the first junction layer opposite to a surface connected to the second photoelectric conversion cell and a surface of the second junction layer opposite to a surface connected to the third photoelectric conversion cells; and a step of removing the first compound-semiconductor substrate. A lattice constant of the first n-type $(Al_{x2}Ga_{1-x2})_{y2}In_{1-y2}P$ layer is greater than a lattice constant of the first photoelectric conversion cell.

Advantageous Effects of Invention

According to embodiments of the present invention, a compound-semiconductor photovoltaic cell and a manufacturing method of the compound-semiconductor photovoltaic cell with enhanced efficiency are provided.

BRIEF DESCRIPTION OF DRAWINGS

FIG. 1 is a cross-sectional diagram illustrating an example of a compound-semiconductor photovoltaic cell 100 according to a first embodiment.

FIG. 2A is a diagram illustrating an example of a relation between relative energy levels of materials themselves of a p-type lattice matching (Al)GaInP and an n-type lattice matching (Al)GaInP.

FIG. 2B is a diagram illustrating an example of a relation between relative energy levels of materials themselves of a p-type AlGaAs and an n-type lattice matching (Al)GaInP.

FIG. 2C is a diagram illustrating an example of a relation between relative energy levels of materials themselves of a p-type lattice matching (Al)GaInP and an n-type (Al)GaInP having a compression strain.

FIG. 2D is a diagram illustrating an example of a relation between relative energy levels of materials themselves of a p-type AlGaAs and an n-type (Al)GaInP having a compression strain.

FIG. 3 is a cross-sectional diagram illustrating an example of a compound-semiconductor photovoltaic cell 200 according to a second embodiment.

FIG. 4 is a cross-sectional diagram illustrating an example of a compound-semiconductor photovoltaic cell 300 according to a third embodiment.

FIG. 5A is a diagram illustrating an example of a manufacturing method of the compound-semiconductor photovoltaic cell 300 according to the third embodiment.

FIG. 5B is a diagram illustrating another example of the manufacturing method of the compound-semiconductor photovoltaic cell 300 according to the third embodiment.

FIG. 6A is a diagram illustrating yet another example of the manufacturing method of the compound-semiconductor photovoltaic cell 300 according to the third embodiment.

FIG. 6B is a diagram illustrating yet another example of the manufacturing method of the compound-semiconductor photovoltaic cell 300 according to the third embodiment.

FIG. 7 is a cross-sectional diagram illustrating an example of a compound-semiconductor photovoltaic cell 400 according to a fourth embodiment.

FIG. 8 is a diagram illustrating an example of a compound-semiconductor photovoltaic cell 400A according to a first variation of the fourth embodiment.

FIG. 9 is a diagram illustrating an example of a relation between relative energy levels of materials themselves of a tunnel junction layer 170A according to the first variation of the fourth embodiment.

FIG. 10 is a diagram illustrating an example of a compound-semiconductor photovoltaic cell 400B according to a second variation of the fourth embodiment.

FIG. 11 is a diagram illustrating an example of a compound-semiconductor photovoltaic cell 400C according to a third variation of the fourth embodiment.

FIG. 12 is a diagram illustrating an example of a relation between relative energy levels of materials themselves of a tunnel junction layer 170B according to the second variation of the fourth embodiment.

FIG. 13 is a diagram illustrating an example of a compound-semiconductor photovoltaic cell 400D according to a fourth variation of the fourth embodiment.

FIG. 14 is a diagram illustrating an example of a relation between relative energy levels of materials themselves of a tunnel junction layer 170C according to the third variation of the fourth embodiment.

FIG. 15 is a cross-sectional diagram illustrating an example of a compound-semiconductor photovoltaic cell 500 according to a fifth embodiment.

DESCRIPTION OF EMBODIMENTS

In the following, embodiments in which a compound-semiconductor photovoltaic cell and a manufacturing method of the compound-semiconductor photovoltaic cell according to the present invention are applied will be described.

Since band gap energy or a lattice constant of a compound-semiconductor varies depending on material composition, multi-junction type photovoltaic cells in which energy conversion efficiency is enhanced by sharing a wavelength range of solar light have been manufactured.

At present, there are triple-junction photovoltaic cells including a Ge cell/Ga(In)As cell/GaInP cell using a lattice matching material on a Ge substrate, which has almost the same lattice constant as gallium arsenide (GaAs), having band gaps for respective cells of 1.88 eV/1.40 eV/0.67 eV.

A compound-semiconductor photovoltaic cell has efficiency which is about twice efficiency of a silicon (Si)-based photovoltaic cell. However, by reason of cost of a substrate, small size of the substrate or the like, the compound-semiconductor photovoltaic cell is several orders of magnitude more expensive than the Si-based photovoltaic cell. Therefore, the compound-semiconductor photovoltaic cells have been used for a special purpose, such as space, in an artificial satellite, for example.

Recently, a compound-semiconductor photovoltaic cell has been put to practical use for a terrestrial application (for general purpose on earth), by combining an inexpensive plastic lens and a small-sized photovoltaic cell, forming a concentrated type cell, reducing an amount of compound-semiconductor which is more expensive than a normal planar cell, and realizing cost reduction.

As a subject for enhancing efficiency, especially in the concentrated type cell, in order to reduce energy loss due to an increase of electric current, multi-junctioning for reducing the electric current and reducing series resistance are important. For reducing the resistance, it is important to reduce especially the resistance of a tunnel junction which connects sub cells.

Here, the tunnel junction is a p-n junction in a semiconductor, in which an impurity is added at high concentration. According to the high density doping, a conduction band of an n-type layer and a valence band of a p-type valence band are degenerated, and the respective energy levels overlap each other across the Fermi level, thereby probability of carrier tunneling increases, and a tunneling current flows. Although electric current normally flows only in a direction from the p-type layer to the n-type layer, in the tunnel junction it is possible to cause electric current to flow in the opposite direction.

In order to form a good tunnel junction in an photovoltaic cell having a photoelectric conversion cell with two or more layers, a material having a band gap, which is almost the same as or wider than that of a GaInP sub cell of a upper part of the tunnel junction, is preferably used for the tunnel junction layer so as to reduce an absorption loss of light in the tunnel junction layer.

More, in addition, the energy difference between the valence band of the p-type layer and the conduction band of the n-type layer structuring the tunnel junction layer is preferably small, since a carrier more easily tunnels and a concentration of carriers (doping concentration) may be smaller than the case where the energy difference is great.

However, it is not easy to perform doping at high concentration. It is important to allow an impurity to enter a film efficiently, and to suppress diffusion of the doped impurity, so as to obtain the required concentration profile or the like.

In the following, first to fifth embodiments to solve the above-described problems will be explained.

Example 1

FIG. 1 is a cross-sectional diagram illustrating a compound-semiconductor photovoltaic cell 100 according to the first embodiment.

The compound-semiconductor photovoltaic cell 100 includes an electrode 10, a gallium arsenide (GaAs) substrate 110, a GaAs buffer layer 111, a GaAs cell 160, a tunnel junction layer 170, a gallium indium phosphide (GaInP) cell 180, a contact layer 40A and an electrode 50.

The compound-semiconductor photovoltaic cell 100 according to the first embodiment is a double-junction type photovoltaic cell which directly connects the GaAs cell 160 (1.42 eV) and the GaInP cell 180 (1.9 eV).

Here, the GaAs cell 160 (1.42 eV) and the GaInP cell 180 (1.9 eV) are GaAs-based photoelectric conversion cells.

The GaAs-based photoelectric conversion cell is a photoelectric conversion cell which almost lattice matches with gallium arsenide (GaAs) or with germanium (Ge) which has almost the same lattice constant as GaAs, and is formed of a material system crystal which can be grown on a GaAs substrate or on a Ge substrate. Here, a material, which almost lattice matches with GaAs or with Ge which has almost the same lattice constant as GaAs, and crystal which can be grown on a GaAs substrate or on a Ge substrate, will be called a GaAs lattice matching system material. Furthermore, a cell made of the GaAs lattice matching system material will be called a GaAs lattice matching system material cell.

In the compound-semiconductor photovoltaic cell 100, all layers are basically formed so as to almost lattice match with GaAs or with Ge which has almost the same lattice constant as GaAs, or so that thicknesses of the respective layers are less than or equal to a critical film thickness that causes a lattice relaxation even in a case where the lattice constants are different from each other.

The compound-semiconductor photovoltaic cell 100 is manufactured by serially forming on a GaAs substrate, a GaAs buffer layer 111, a GaAs cell 160, a tunnel junction layer 170, a GaInP cell 180, a contact layer 40A and an electrode 50, and finally by forming an electrode 10.

The GaAs substrate 110 is an example of a compound-semiconductor substrate. The GaInP cell 180 is an example of a first photoelectric conversion cell manufactured from a first compound-semiconductor material which lattice matches with GaAs or Ge. The tunnel junction layer 170 is an example of a first tunnel junction layer. The GaAs cell 160 is an example of a second photoelectric conversion cell manufactured from a second compound-semiconductor material which is a GaAs-based material.

In FIG. 1, an incident direction of light is a direction from an upper part to a lower part in the drawing (direction from the GaInP cell 180 to the GaAs cell 160).

The electrode 10 is an electrode which is a lower electrode positioned on a deep side in the light incident direction. For the electrode 10, for example, metal layers of Ti (titanium)/Pt (platinum)/Au (gold) or the like may be used.

For the GaAs substrate 110, for example, a wafer of a single crystal of p-type gallium arsenide may be used. For impurity, for example, zinc (Zn) or the like may be used.

The GaAs buffer layer 111 may be formed on the GaAs substrate 110 by MOCVD (metalorganic chemical vapor deposition) method, for example. For impurity, for example, carbon (C) or the like may be used so that a conductivity type is p-type.

The GaAs cell 160 is formed on the GaAs buffer layer III. The GaAs cell 160 includes a p-type GaInP layer 161, a p-type GaAs layer 162, an n-type GaAs layer 163 and an n-type (Al)GaInP layer 164.

The GaInP layer 161, the GaAs layer 162, the GaAs layer 163 and the (Al)GaInP layer 164 are laminated on a surface of the GaAs buffer layer 111 in this order.

The GaInP layer 161 is a BSF (Back Surface Field) layer arranged on a deep side in the light incident direction. A p-n junction in the GaAs cell 160 is structured by the GaAs layer 162 and the GaAs layer 163. The (Al)GaInP layer 164 is a window layer arranged on a near side in the light incident direction (light incident side).

Here, the expression "GaInP" of the GaInP layer 161 represents specifically $Ga_xIn_{1-x}P$ ($0<x<1$). However, in the following the simplified expression "GaInP" will be used. Moreover, the expression "(Al)GaInP" of the (Al)GaInP layer 164 represents specifically $(Al_xGa_{1-x})_yIn_{1-y}P$ ($0 \leq x < 1$, $0 < y < 1$). However, in the following the simplified expression "(Al)GaInP" will be used. Furthermore, the notation "(Al)" covers the case of including Al and the case of not including Al.

Here, the GaAs cell 160 may be regarded as a cell whose configuration includes the GaAs layer 162 and the GaAs layer 163 that structure the p-n junction, on the light incident side of which the (Al)GaInP layer 164 is formed, and on the deep side of which in the light incident direction the GaInP layer 161 is formed.

The GaInP layer 161 only has to have a band gap greater than or equal to a band gap (1.42 eV) between the p-type GaAs layer 162 and the n-type GaAs layer 163, since the GaInP layer 161 is used as the BSF layer. For impurity of the GaInP layer 161, for example, zinc (Zn) may be used.

A conduction type of the GaAs layer 162 is made p-type by using Zn for impurity, for example.

A conduction type of the GaAs layer 163 is made n-type by using Si for impurity, for example.

A band gap between the GaAs layer 162 and the GaAs layer 163 is 1.42 eV.

The (Al)GaInP layer 164 has a band gap greater than the band gap (1.42 eV) between the p-type GaAs layer 162 and the n-type GaAs layer 163, since the (Al)GaInP layer 164 is used as a window layer.

In the first embodiment, for impurity of the (Al)GaInP layer 164, for example, silicon (Si) may be used.

The tunnel junction layer 170 is arranged between the GaAs cell 160 and the GaInP cell 180. Since the compound-semiconductor photovoltaic cell 100 is manufactured by laminating serially from the lower side, in a state shown in FIG. 1, the tunnel junction layer 170 is laminated on the GaAs cell 160.

The tunnel junction layer 170 includes an n$^+$-type (Al)GaInP layer 171, and a p$^+$-type (Al)GaAs layer 172. For impurity in the (Al)GaInP layer 171, for example, tellurium (Te) may be used so that the conductivity type is n-type. For impurity in the (Al)GaAs layer 172, for example, carbon (C) may be used so that the conductivity type is p-type. The n$^+$-type (Al)GaInP layer 171 and the p$^+$-type (Al)GaAs layer 172 form a thin p-n junction which is doped at high concentration.

Both the (Al)GaInP layer 171 and the (Al)GaAs layer 172 are doped at higher concentration than the GaInP cell 180. The tunnel junction layer 170 is a junction layer arranged so that electric current flows between the p-type GaInP layer 182 in GaInP cell 180 and the n-type GaAs layer 163 in the GaAs cell 160 by the tunnel junction.

Here, the (Al)GaInP layer 171 and the (Al)GaAs layer 172 are examples of a first n-type (Al)GaInP layer and a first p-type (Al)Ga(In)As layer, respectively.

The expression "(Al)GaInP" represents specifically $(Al_1Ga_{1-x})_yIn_{1-y}P$ (0≤x<1, 0<y<1). However, in the following the simplified expression "(Al)GaInP" will be used. Moreover, the notation "(Al)" covers the case of including Al and the case of not including Al.

The expression "(Al)Ga(In)As" represents specifically $(Al_xGa_{1-x})_yIn_{1-y}As$ (0≤x<1, 0<y≤1). However, in the following the simplified expression "(Al)Ga(In)As" will be used. Moreover, the notation "(Al)" covers the case of including Al and the case of not including Al, and the notation "(In)" covers the case of including In and the case of not including In.

A lattice constant of the (Al)GaInP layer 171 is greater than a lattice constant of GaAs, and has a compression strain.

A composition of Al in the (Al)GaAs layer 172 is adjusted so that a band gap becomes almost the same as a band gap of the GaInP cell 180.

A sum of thicknesses of the (Al)GaInP layer 171 and the (Al)GaAs layer 172 is, for example, greater than or equal to 25 nm but less than or equal to 50 nm.

Here, the expression "(Al)GaInP" of the (Al)GaInP layer 171 represents specifically $(Al_xGa_{1-x})_yIn_{1-y}P$ (0≤x<1, 0<y<1). However, in the following the simplified expression "(Al)GaInP" will be used. Moreover, the notation "(Al)" covers the case of including Al and the case of not including Al.

Moreover, the expression "(Al)GaAs" of the (Al)GaAs layer 172 represents specifically $Al_xGa_{1-x}As$ (0≤x<1). However, in the following the simplified expression "(Al)GaAs" will be used. Moreover, the notation "(Al)" covers the case of including Al and the case of not including Al.

Moreover, since a material of the tunnel junction layer 170 has preferably a band gap almost the same as or greater than that of the GaInP cell 180, which is positioned on the light incident side, it is considered that n$^+$-GaInP which lattice matches with the GaInP cell 180 may be used for the n layer of the tunnel junction layer 170.

However, in the first embodiment, Al is added to the above-described material used for the (Al)GaInP layer 171 so as to have the same band gap as GaInP, and the composition of In is increased so as to make the lattice constant greater than GaAs, and thereby the (Al)GaInP layer 171 has a compression strain.

Meanwhile, the reason why the lattice constant of the (Al)GaInP layer 171 is set as above will be described later.

The GaInP cell 180 is formed between the tunnel junction layer 170 and the contact layer 40A.

The GaInP cell 180 includes a p-type Al(Ga)InP layer 181, a p-type GaInP layer 182, an n-type GaInP layer 183 and an n-type Al(Ga)InP layer 184.

The Al(Ga)InP layer 181, the GaInP layer 182, the GaInP layer 183 and the Al(Ga)InP layer 184 are laminated on a surface of the tunnel junction layer 170 in this order. The GaInP cell 180 is laminated on the tunnel junction layer 170.

The GaInP cell 180 is made of crystalline layers of GaInP which lattice match with GaAs. In an actual manufacturing process, for example, the Al(Ga)InP layer 181, the GaInP layer 182, the GaInP layer 183 and the Al(Ga)InP layer 184 are laminated in this order.

The Al(Ga)InP layer 181 is a BSF (Back Surface Field) layer arranged on a deep side in the light incident direction. A p-n junction in the GaInP cell 180 is structured by the GaInP layer 182 and the GaInP layer 183. The Al(Ga)InP layer 184 is a window layer arranged on a near side in the light incident direction (light incident side).

Here, the GaInP cell 180 may be regarded as a cell whose configuration includes the GaInP layer 182 and the GaInP layer 183 that structure the p-n junction, on the light incident side of which the Al(Ga)InP layer 184 is formed, and on the deep side of which in the light incident direction the Al(Ga)InP layer 181 is formed.

The Al(Ga)InP layer 181 only has to have a band gap greater than or equal to a band gap (1.9 eV) between the p-type GaInP layer 182 and the n-type GaInP layer 183, since the Al(Ga)InP layer 181 is used as the BSF layer. For impurity of the Al(Ga)InP layer 181, for example, zinc (Zn) may be used.

A conduction type of the GaInP layer 182 is made p-type by using Zn for impurity, for example.

A conduction type of the GaInP layer 183 is made n-type by using Si for impurity, for example.

A band gap between the GaInP layer 182 and the GaInP layer 183 is 1.9 eV.

The Al(Ga)InP layer 184 has a band gap greater than the band gap (1.9 eV) between the p-type GaInP layer 182 and the n-type GaInP layer 183, since the Al(Ga)InP layer 184 is used as a window layer.

Here, the expression "Al(Ga)InP" of the Al(Ga)InP layer 181 represents specifically $(Al_xGa_{1-x})_yIn_{1-y}P$ ($0 \leq x \leq 1$, $0 < y \leq 1$). However, in the following the simplified expression "Al(Ga)InP" will be used. The notation "(Ga)" represents both a composition including Ga and a composition not including Ga. The above-described expression is also used for the Al(Ga)InP layer 184. However, values of x and y of the Al(Ga)InP layer 181 may be different from those of the Al(Ga)InP layer 184.

Moreover, the expression "GaInP" of the GaInP layer 182 represents specifically $Ga_xIn_{1-x}P$ ($0 < x < 1$). However, in the following the simplified expression "GaInP" will be used. The above-described expression is also used for the GaInP layer 183. A value x of the GaInP layer 182 may be different from that of the GaInP layer 183.

In the first embodiment, the Al(Ga)InP layer 184 only has to have a band gap greater than or equal to a band gap (1.9 eV) between the p-type GaInP layer 182 and the n-type GaInP layer 183. For impurity of the Al(Ga)InP layer 184, for example, silicon (Si) may be used.

The contact layer 40A is laminated on the GaInP cell 180 in order to perform an ohmic connection to the electrode 50. For example, a gallium arsenide (GaAs) layer is used for the contact layer 40A.

The electrode 50 is, for example, a metallic thin film, such as Ti/Pt/Au, and formed on the contact layer 40A.

Meanwhile, the contact layer 40A is formed by removing a gallium arsenide (GaAs) layer, which was formed on a whole surface of the Al(Ga)InP layer 184, using the electrode 50 (upper electrode) as a mask.

Moreover, the compound-semiconductor photovoltaic cell 100 has a configuration in which solar light enters the compound-semiconductor photovoltaic cell 100 from a side of a cell of a wide band gap (side of the GaInP cell 180). Meanwhile, an antireflection film is preferably provided on a surface of the Al(Ga)InP layer 184, which solar light enters.

FIGS. 2A to 2D are diagrams illustrating a relation between relative energy levels of materials themselves of p-type AlGaAs and n-type (Al)GaInP having a compression strain. Here, the reason why the combination of the (Al)GaInP layer 171 and the (Al)GaAs layer 172 is employed will be explained with reference to FIGS. 2A to 2D.

FIG. 2A illustrates a band structure of a tunnel junction layer joining a p-type (Al)GaInP layer, which lattice matches with GaAs, and an n-type (Al)GaInP layer, which lattice matches with GaAs. A band structure of the p-type (Al)GaInP layer is shown in a left half of FIG. 2A, and a band structure of the n-type (Al)GaInP layer is shown in a right half of FIG. 2A. Meanwhile, the notation (Al)GaInP represents both a composition including Al and a composition not including Al.

In FIG. 2A, since both the p layer and the n-layer are (Al)GaInP layers, band gaps Eg of the p layer and the n layer are the same, heights of conduction band and of valence band are not changed between the p layer and the n layer, and no discontinuity occurs. Then, the junction shown in FIG. 2A is a so-called "homo junction".

FIG. 2B illustrates a band structure of a tunnel junction layer joining a p-type AlGaAs layer, which lattice matches with GaAs, and an n-type (Al)GaInP layer, which lattice matches with GaAs.

Both energies of a conduction band and of a valence band of the n-type (Al)GaInP layer, which lattice matches with GaAs, are lower than energies of a conduction band and of a valence band of the p-type AlGaAs layer, which lattice matches with GaAs, respectively. That is, a so-called "type II hetero junction" is obtained.

In the junction shown in FIG. 2B, an energy difference E1 between the valence band of the p-type AlGaAs layer, which lattice matches with GaAs, and the conduction band of the n-type (Al)GaInP layer, which lattice matches with GaAs, is smaller than any of band gaps of the respective layers. Therefore, probability of carrier tunneling increases, compared with the tunnel junction shown in FIG. 2A.

FIG. 2C illustrates a band structure of a tunnel junction layer joining a p-type (Al)GaInP layer, which lattice matches with GaAs, and an n-type (Al)GaInP layer having a compression strain.

The n-type (Al)GaInP having a compression strain is formed by laminating (Al)GaInP, a composition of which is adjusted so as to have a greater lattice constant than the lattice constant of GaAs, on a layer lattice matching with GaAs, to have a compression strain.

Here, layers, a composition of which is adjusted so as to lattice match with GaAs, are, for example, the GaInP cell 180 and the GaAs cell 160 (See FIG. 1).

The GaInP having greater lattice constant than GaAs has energy of a valence band, which is slightly lower than the energy of the valence band of the GaInP lattice matching with GaAs, and energy of a conduction band, which is greatly lower than the energy of conduction band of the GaInP lattice matching with GaAs. Then, a band gap decreases.

Moreover, upon adding Al to the above-described GaInP having greater lattice constant than GaAs, the energy of the conduction band increases and the energy of the valence band decreases, and thereby the band gap increases.

Accordingly, in a tunnel junction layer of the p-type (Al)GaInP layer, which lattice matches with GaAs, and the n-type (Al)GaInP layer having a compression strain, both a conduction band and a valence band of the n-type (Al)GaInP layer having a compression strain are lower than the conduction band and the valence band of the p-type (Al)GaInP layer, which lattice matches with GaAs, respectively. Then, a so-called "type II junction of hetero junction" is obtained.

An energy difference E2 between the valence band of the p-type (Al)GaInP layer which lattice matches with GaAs, and the conduction band of the n-type (Al)GaInP layer having a compression strain, is smaller than any of band gaps of the respective layers. Therefore, probability of carrier tunneling increases, compared with the tunnel junction shown in FIG. 2A.

Meanwhile, in order to cause the p-type (Al)GaInP layer, which lattice matches with GaAs, and the n-type (Al)GaInP layer having a compression strain to have the same band gap, an Al composition of the n-type (Al)GaInP layer having a compression strain is required to be greater than an Al composition of the p-type (Al)GaInP layer, which lattice matches with GaAs.

According to the above, as shown FIG. 2D, upon joining an AlGaAs layer with an n-type (Al)GaInP layer having a compression strain, it is found that a discontinuity of band becomes greater compared with the tunnel junction of the AlGaAs layer, shown in FIG. 2B, and the (Al)GaInP layer, which lattice matches with GaAs.

The n-type (Al)GaInP layer shown in FIG. 2D and the p-type AlGaAs layer correspond to the $n^+$-type (Al)GaInP layer 171 and the $p^+$-type (Al)GaAs layer 172, respectively.

A tunnel junction is a p-n junction of semiconductors in which impurity is added at high concentration. In the tunnel junction, due to the doping at high concentration, a conduction band of an n-type layer and a valence band of p-type layer are degenerated, and the respective energy levels overlap each other across the Fermi level, thereby probability of carrier tunneling increases, and a tunneling current flows.

For this reason, as shown in FIG. 2D, in a case of joining the AlGaAs layer having a greater energy of conduction band and a greater energy of valence band, as a $p^+$-layer, and the (Al)GaInP layer having a compression strain, as an $n^+$-layer, an energy difference E3 between the valence band of the AlGaAs layer and the conduction band of the (Al)GaInP layer having a compression strain is less than the energy difference E1 shown in FIG. 2B, and the probability of carrier tunneling increases more.

According to the above-described reason, in the first embodiment, the tunnel junction layer 170 (See FIG. 1) including the (Al)GaInP layer 171 having a compression strain and the (Al)GaAs layer 172 is employed. The (Al)GaInP layer 171 having a compression strain is an (Al)GaInP layer having a greater lattice constant than the lattice constant of GaAs.

Moreover, since the GaInP cell 180 is made of a crystalline layer of GaInP, which lattice matches with GaAs, the (Al)GaInP layer 171 having a compression strain has a greater lattice constant than the lattice constant of the GaInP cell 180.

The tunnel junction layer 170 lowers energy levels of the conduction band and the valence band, by using the (Al)GaInP layer 171 having a compression strain, compared with a case of having no compression strain.

Then, by reducing the energy difference E3 (See FIG. 2D) between the valence band of the (Al)GaAs layer 172 and the conduction band of the (Al)GaInP layer 171, a loss of carrier in the tunnel junction layer 170 is suppressed or reduced.

Accordingly, in the first embodiment, a resistance value of the tunnel junction layer 170 decreases, energy loss is reduced, and thereby a compound-semiconductor photovoltaic cell of high efficiency 100 can be provided. Meanwhile, the energy loss is reduced, since the resistance value of the tunnel junction layer 170 decreases.

Moreover, in the tunnel junction layer 170, a carrier concentration (doping concentration) may be lower compared with the case where an energy difference between a valence band of a $p^+$-layer and a conduction band of an $n^+$-layer is great, and a tunnel junction can be formed easily.

Meanwhile, in the above, the embodiment, in which the (Al)GaInP layer 171 is used for an $n^+$-layer of the tunnel junction layer 170, is explained. The GaInP to which Al is not added may be used.

Moreover, an (Al)GaInPAs layer, to which Al is added to increase a band gap and arsenic (As) is added to adjust the lattice constant, may be used for the $n^+$-layer of the tunnel junction layer 170. The expression "(Al)GaInPAs" represents specifically $(Al_xGa_{1-x})_yIn_{1-y}P_zAs_{1-z}$ ($0 \leq x < 1$, $0 < y < 1$, $0 < z < 1$). However, in the following the simplified expression "(Al)GaInPAs" will be used. Moreover, the notation "(Al)" covers the case of including Al and the case of not including Al.

That is, a composition formula of the $n^+$-layer of the tunnel junction layer is expressed by (Al)GaInP(As). The notation (Al) in this expression represents both a composition including Al and a composition not including Al. The notation (As) represents both a composition including As and a composition not including As. In this way, the compositions of the $p^+$-layer and the $n^+$-layer of the tunnel junction layer 170 may be adjusted in each case. Compositions of a $p^+$-layer and an $n^+$-layer may be adjusted also in the other embodiments.

Moreover, in the present embodiment, the example of including the (Al)GaAs layer 172 as the $p^+$-layer of the tunnel junction layer 170 is explained. However, AlGaInAs in which In is added may be used. That is, the $p^+$-layer of the tunnel junction layer 170 only has to be expressed as AlGa(In)As. The notation (In) represents both a composition including In and a composition not including In.

Example 2

FIG. 3 is a cross-sectional diagram illustrating a compound-semiconductor photovoltaic cell 200 according to a second embodiment.

The compound-semiconductor photovoltaic cell 200 is obtained by replacing, in the compound-semiconductor photovoltaic cell 100 according to the first embodiment, the GaAs cell 160 (1.42 eV) and the GaInP cell 180 (1.9 eV) by a GaInAs cell 260 (1.4 eV) and a GaInP cell 280 (1.88 eV), respectively.

Moreover, the compound-semiconductor photovoltaic cell 200 becomes a triple-junction type by further adding a Ge cell 210 (0.67 eV).

The compound-semiconductor photovoltaic cell 200 includes an electrode 10, a Ge cell 210, a GaInP buffer layer 213, a GaAs buffer layer 214, a tunnel junction layer 150, a GaInAs cell 260, a tunnel junction layer 170, a GaInP cell 280, a contact layer 40A and an electrode 50.

Meanwhile, in the compound-semiconductor photovoltaic cell 200, to the same composition element as in the compound-semiconductor photovoltaic cell 100 according to the first embodiment, the same reference numeral is assigned, and an explanation thereof will be omitted.

The compound-semiconductor photovoltaic cell 200 is manufactured by serially forming on a Ge substrate 211 of the Ge cell 210, the GaInP buffer layer 213, the GaAs buffer layer 214, the tunnel junction layer 150, the GaInAs cell 260, the tunnel junction layer 170, the GaInP cell 280, the contact layer 40A and the electrode 50, and finally by forming an electrode 10.

The Ge cell 210 includes the p-type Ge substrate 211 and an n-type Ge layer 212. A conduction type of the Ge layer 212 is n-type by using diffusion of phosphorus (P) in the GaInP buffer layer 213 formed on the Ge layer 212. The Ge cell 210 is an example of a third photoelectric conversion cell.

The GaInP buffer layer 213 may be formed on the Ge cell 210 by MOCVD method, for example. For impurity, for example, silicon (Si) or the like may be used so that a conductivity type is n-type. The GaInP buffer layer 213 is an example of a first buffer layer.

The GaAs buffer layer 214 may be formed on the GaInP buffer layer 213 by MOCVD method, for example. For impurity, for example, silicon (Si) or the like may be used so that a conductivity is n-type. The GaAs buffer layer 214 is an example of a second buffer layer.

The tunnel junction layer 150 is arranged between the GaAs buffer layer 214 and the GaInAs cell 260.

The tunnel junction layer 150 includes an $n^+$-type GaAs layer 151 and a $p^+$-type GaAs layer 152. For impurity, for example, tellurium (Te) may be used so that the conductivity type is n-type. For impurity, for example, carbon (C) may be used so that the conductivity type is p-type. The $n^+$-type GaAs layer 151 and the p+-type GaAs layer 152 configure a thin p-n junction which is doped at high concentration.

Both the GaAs layers 151 and 152 of the tunnel junction layer 150 are doped at higher concentration than the GaInAs cell 260. The tunnel junction layer 150 is a junction layer arranged so that electric current flows between the p-type Ga(In)As layer 262 of the GaInAs cell 260, and the n-type Ge layer 212 of the Ge cell 210 by the tunnel junction.

The GaInAs cell 260 includes a p-type GaInP layer 161, a p-type Ga(In)As layer 262, an n-type Ga(In)As layer 263 and an n-type (Al)GaInP layer 164. The GaInAs cell 260 is a GaAs-based photoelectric conversion cell.

That is, the GaInAs cell 260 is obtained by replacing, in the GaAs cell 160 according to the first embodiment (See FIG. 1), the p layer and n layer which perform photoelectric conversion by the Ga(In)As layer 262 and the Ga(In)As layer 263, which have an In composition of 1.5% and a band gap of 1.40 eV. The GaInAs cell 260 is an example of a second photoelectric conversion cell.

Here, the expression "Ga(In)As" of the Ga(In)As layer 262 represents specifically $Ga_{1-x}In_xAs$ (0≤x<1). However, in the following the simplified expression "Ga(In)As" will be used. Moreover, the notation "(In)" covers the case of including In and the case of not including In. The above-described expression is also used for the Ga(In)As layer 263. However, a value of x of the Ga(In)As layer 263 may be different from that of the Ga(In)As layer 262.

The GaInP cell 280 includes, as in the GaInP cell 180 (1.9 eV) according to the first embodiment, a p-type Al(Ga)InP layer 181, a p-type GaInP layer 182, an n-type GaInP layer 183 and an n-type Al(Ga)InP layer 184. In the GaInP cell 280, a band gap is adjusted to 1.88 eV by adjusting a film forming condition or the like. The GaInP cell 280 is an example of a first photoelectric conversion cell.

In the second embodiment, the tunnel junction layer 170 including an (Al)GaInP layer 171 and an (Al)GaAs layer 172 is used between the GaInAs cell 260 and the GaInP cell 280.

The compound-semiconductor photovoltaic cell 200 is formed so that the respective layers almost lattice match with germanium (Ge) in order to serially form the respective layers on the Ge substrate 211.

Therefore, the (Al)GaInP layer 171, in the second embodiment, is formed by laminating (Al)GaInP, a composition of which is adjusted so as to have a greater lattice constant than the lattice constant of Ge, on a layer lattice matching with Ge, to have a compression strain.

Here, the layers lattice matching with Ge are all of the Ge layer 212, the GaInP buffer layer 213, the GaAs buffer layer 214, the tunnel junction layer 150, the GaInAs cell 260 and the GaInP cell 280.

Meanwhile, since the lattice constant of germanium (Ge) is approximately the same as the lattice constant of GaAs, the (Al)GaInP layer 171 according to the first embodiment can be used in the second embodiment approximately as it is. Since the lattice constant of Ge is slightly greater than the lattice constant of GaAs, the (Al)GaInP layer 171, in which the In composition is great, is preferably used.

The tunnel junction layer 170 lowers energy levels of the conduction band and the valence band, by using the (Al)GaInP layer 171 having a compression strain, compared with a case of having no compression strain.

Then, by reducing the energy difference E3 (See FIG. 2D) between the valence band of the (Al)GaAs layer 172 and the conduction band of the (Al)GaInP layer 171, a loss of carrier in the tunnel junction layer 170 is suppressed or reduced.

Accordingly, in the second embodiment, a triple-junction type compound-semiconductor photovoltaic cell 200, in which the resistance value decreases, the energy loss is reduced and the efficiency is enhanced, is provided.

Moreover, a carrier concentration (doping concentration) may be lower compared with the case where an energy difference between a valence band of a p+-layer and a conduction band of an n+-layer is great, and a tunnel junction can be formed easily.

Meanwhile, the n+-type GaAs layer 151 of the tunnel junction layer 150 may have a compression strain, as the (Al)GaInP layer 171. In this case, the lattice constant of the GaAs layer 151 has only to be set greater than the lattice constant of the layer, the composition of which is adjusted so as to lattice match with Ge (the GaInP cell 280 or the GaInAs cell 260). In this case, the tunnel junction layer is an example of a second tunnel junction layer.

Moreover, a band gap of the GaAs layer 151 with a compression strain may be adjusted in relation to the band gap of the GaInAs cell 260.

Moreover, in the present embodiment, as described above, the example including a Ge cell 210 in which the Ge layer 212 is formed on the Ge substrate 211 is explained. However, instead of the Ge cell 210, a cell formed from a material, which lattice matches with GaAs and has a smaller band gap than the GaInAs cell 260, such as GaInNAs, may be used. In this case, the cell used instead of the Ge cell 210 only has to have a band gap smaller than the GaInAs cell 260.

Example 3

FIG. 4 is a cross-sectional diagram illustrating an example of a compound-semiconductor photovoltaic cell 300 according to a third embodiment.

The compound-semiconductor photovoltaic cell 300 according to the third embodiment includes an electrode 10, an InP substrate 310, a GaInPAs cell 120, a junction layer 130, a tunnel junction layer 150A, a GaAs cell 160, a tunnel junction layer 170, a GaInP cell 180, a contact layer 40A and an electrode 50.

The compound-semiconductor photovoltaic cell 300 is obtained by removing the GaAs substrate 110 and the GaAs buffer layer 111 from the compound-semiconductor photovoltaic cell 100 according to the first embodiment, and adding the InP substrate 310, the GaInPAs cell 120, the junction layer 130 and the tunnel junction layer 150A to it.

In this case, by joining the junction layer 130 and the tunnel junction layer 150A, the two laminated bodies are joined, and a tunnel junction is formed by the junction layer 130 and the tunnel junction layer 150A.

For the InP substrate 310, for example, a wafer of a single crystal of p-type indium phosphide may be used. For impurity, for example, zinc (Zn) or the like may be used.

Meanwhile, the GaInPAs cell 120 is an example of a third photoelectric conversion cell. The GaAs cell 160 and the GaInP cell 180 are examples of a second photoelectric conversion cell and a first photoelectric conversion cell, respectively.

The GaInPAs cell 120 is formed on a surface of the InP substrate 310. The GaInPAs cell 120 includes a p-type InP layer 121, a p-type GaIn(P)As layer 122, an n-type GaIn(P) As layer 123 and an n-type Al(Ga)InAs layer 124.

The GaInPAs cell 120 is made of crystalline layers of GaInPAs which lattice matches with InP.

The InP layer 121, the GaIn(P)As layer 122, the GaIn(P) As layer 123 and the Al(Ga)InAs layer 124 are laminated on the surface of the InP substrate 310 in this order.

The InP layer 121 is a BSF (Back Surface Field) layer arranged on a deep side in the light incident direction. A p-n junction in the GaInPAs cell 120 is structured by the GaIn(P)As layer 122 and the GaIn(P)As layer 123. The Al(Ga)InAs layer 124 is a window layer arranged on a near side in the light incident direction (light incident side).

Here, the GaInPAs cell 120 may be regarded as a cell, which is made of the GaIn(P)As layer 122 and the GaIn(P) As layer 123 that structure the p-n junction, on the light incident side of which the Al(Ga)InAs layer 124 is formed, and on the deep side of which in the light incident direction the InP layer 121 is formed.

The InP layer 121 has a band gap greater than a band gap (1.0 eV) between the p-type GaIn(P)As layer 122 and the n-type GaIn(P)As layer 123, since the InP layer 121 is used as the BSF layer. For impurity of the InP layer 121, for example, zinc (Zn) may be used.

A conduction type of the GaIn(P)As layer 122 is p-type by using Zn for impurity, for example.

A conduction type of the GaIn(P)As layer 123 is n-type by using Si for impurity, for example.

In the GaIn(P)As layer 122 and the GaIn(P)As layer 123, the ratio of Ga, x, and the ratio of P, y, are adjusted so that the band gap is 1.0 eV.

The Al(Ga)InAs layer 124 has a band gap greater than the band gap (1.0 eV) of the GaIn(P)As layer 122 and the GaIn(P)As layer 123, since the Al(Ga)InAs layer 124 is used as a window layer.

Here, the expression "GaIn(P)As" of the GaIn(P)As layer 122 represents specifically $Ga_xIn_{1-x}P_yAs_{1-y}$ (0<x<1, 0≤y<1). However, in the following the simplified expression "GaIn (P)As" will be used. The notation "(P)" covers the case of including P and the case of not including P. The above-described expression is also used for the GaIn(P)As layer 123. However, values of x and y of the GaIn(P)As layer 122 may be different from those of the GaIn(P)As layer 123.

The expression "Al(Ga)InAs" of the Al(Ga)InAs layer 124 represents specifically $(Al_xGa_{1-x})_yIn_{1-y}As$ (0<x≤1, 0<y<1). However, in the following the simplified expression "Al(Ga)InAs" will be used. Furthermore, the notation "(Ga)" covers the case of including Ga and the case of not including Ga.

In the third embodiment, the band gap of the Al(Ga)InAs layer 124 is set to, for example, 1.5 eV. For impurity of the Al(Ga)InAs layer 124, for example, silicon (Si) may be used.

Since AlGaInAs lattice matches with InP, it is suitable for being laminated on the GaIn(P)As layer 123.

The junction layer 130 is joined to the tunnel junction layer 150A in the process of manufacturing the compound-semiconductor photovoltaic cell 300 by a cleaning treatment and a surface activation treatment. The compound-semiconductor photovoltaic cell 300 is manufactured by joining the two laminated bodies.

The junction layer 130 is formed on an uppermost surface of one of the two laminated bodies, and the tunnel junction layer 150A is formed on an uppermost surface of the other laminated body. By joining the junction layer 130 and the tunnel junction layer 150A, the compound-semiconductor photovoltaic cell 300 as shown in FIG. 4 is manufactured.

As the junction layer 130, an $n^+$-type InP layer is used. An impurity concentration of the junction layer 130 is set higher than an impurity concentration of the Al(Ga)InAs layer 124. Therefore, a conduction type of the junction layer 130 is n-type.

The InP layer used as the junction layer 130 has, for example, a band gap of 1.35 eV.

The tunnel junction layer 150A is a $p^+$-type GaAs layer. For an impurity, by which a conduction type becomes p-type, for example, carbon (C) may be used. The tunnel junction layer 150A joins the junction layer 130 to form a thin p-n junction which is doped at high concentration.

The tunnel junction layer 150A and the junction layer 130 are doped at higher concentration than the GaAs cell 160.

Next, a manufacturing method of the compound-semiconductor photovoltaic cell 300 according to the third embodiment will be explained with reference to FIGS. 5A to 6B.

FIGS. 5A to 6B are cross-sectional diagrams illustrating compound-semiconductor photovoltaic cells during a procedure of manufacturing the compound-semiconductor photovoltaic cell 300 according to the third embodiment.

At first, as shown in FIG. 5A, a laminated body 300B is manufactured using an InP substrate 310, while manufacturing a laminated body 300A using a GaAs substrate 20. The GaAs substrate 20 is an example of a first compound-semiconductor substrate. The InP substrate 310 is an example of a second compound-semiconductor substrate.

Here, a GaInP cell 180 included in the laminated body 300A is made of crystalline layers of GaInP which lattice matches with GaAs, and is formed on the GaAs substrate 20. Moreover, a GaInPAs cell 120 included in the laminated body 300B is made of crystalline layers of GaInPAs which lattice matches with InP, and is formed on the InP substrate 310.

In this way, lattice constants of the laminated body 300A and the laminated body 300B are different from each other. The compound-semiconductor photovoltaic cell 300 according to the third embodiment is manufactured by directly joining the laminated body 300A and the laminated body 300B, lattice constants of which are different from each other.

Since the lattice constant of InP is about 0.587 nm or 5.87 angstroms, it is only necessary to adjust a composition so that the GaInPAs cell 120 formed on the InP substrate 310 has a lattice constant quite close to the lattice constant (about 0.587 nm or 5.87 angstroms) of InP.

Moreover, since the lattice constant of GaAs is about 0.565 nm or 5.65 angstroms, it is only necessary to adjust compositions so that a GaAs cell 160 and a GaInP cell 180, which are formed on the GaAs substrate 20, have lattice constants quite close to the lattice constant (about 0.565 nm or 5.65 angstroms) of GaAs.

The laminated body 300A is manufactured by laminating on the GaAs substrate 20, a GaInP etching stop layer 30, an $n^+$-type GaAs contact layer 40, the GaInP cell 180, the tunnel junction layer 170, the GaAs cell 160, and the tunnel junction layer 150A by MOCVD (Metal Organic Chemical Vapor Deposition) method. Meanwhile, the expression "GaInP" of the GaInP etching stop layer 30 represents specifically $Ga_xIn_{1-x}P$ (0<x<1).

Here, the GaInP cell 180 includes an Al(Ga)InP layer 184 which lattice matches with GaAs, a GaInP layer 183, a GaInP layer 182 and an Al(Ga)InP layer 181. The Al(Ga)InP layer 181 is a BSF layer, and the Al(Ga)InP layer 184 is a window layer.

Moreover, the tunnel junction layer 170 includes an (Al)GaAs layer 172 and an (Al)GaInP layer 171.

The GaAs cell 160 includes an (Al)GaInP layer 164, a GaAs layer 163, a GaAs layer 162 and a GaInP layer 161. The GaInP layer 161 is a BSP layer, and the (Al)GaInP layer 164 is a window layer.

Moreover, the tunnel junction layer 150A is made of a $p^+$-type GaAs layer.

Upon the lamination (growth) of the laminated body 300A, the lower side having the GaAs substrate 20 is a light incident side. Since the laminated body 300A is turned upside down upon joining to the laminated body 300B later, the laminated body 300A grows from an opposite direction with respect to the vertical relationship shown in FIG. 1.

Specifically, it serially grows from a cell of a wide band gap (GaInP cell 180) to a narrow gap cell (GaAs cell 160). Moreover, finally a p-side becomes the lower side (deep side in the light incident direction).

Moreover, for the laminated body 300B, on the InP substrate 310, by MOCVD method, the GaInPAs cell 120 and the junction layer 130 are laminated (grown). In the laminated body 300B shown in FIG. 5A, a side of the junction layer 130, which is opposite to the InP substrate 310, is a light incident side.

The GaInPAs cell 120 includes, from a side of the InP substrate 310, an InP layer 121, a GaIn(P)As layer 122, a GaIn(P)As layer 123 and an Al(Ga)InAs layer 124. The InP layer 121 is a BSF layer, and the Al(Ga)InAs layer 124 is a window layer.

As described above, the laminated bodies 300A and 300B are manufactured through epitaxial growth by MOCVD method.

Next, as shown in FIG. 5B, the laminated bodies 300A and 300B which are manufactured through epitaxial growth are joined directly.

Surfaces of the tunnel junction layer 150A of the laminated body 300A and the junction layer 130 of the laminated body 300B are subjected to a cleaning treatment and a surface activation treatment, and the junction layer 130 and the tunnel junction layer 150A are joined directly. The surface activation treatment is performed by a nitrogen ($N_2$) plasma treatment, and the junction is performed in a vacuum at temperature of 150° C.

According to the above-described processes, a laminated body 300C, as shown in FIG. 5B, is prepared. The laminated body 300C is manufactured by placing the laminated body 300A, which is turned upside down, i.e. in a state where the tunnel junction layer 150A is on the bottom side, on the junction layer 130 of the laminated body 300B, shown in FIG. 5A, and joining the junction layer 130 and the tunnel junction layer 150A.

Meanwhile, the tunnel junction layer 150A is an example of a first junction layer, and the junction layer 130 is an example of a second junction layer.

The laminated body 300C is made by laminating on the InP substrate 310, the GaInPAs cell 120, the junction layer 130, the tunnel junction layer 150A, the GaAs cell 160, the tunnel junction layer 170, the GaInP cell 180, the GaAs contact layer 40, an InP etching stop layer 30 and the GaAs substrate 20, in this order.

Next, the GaAs substrate 20 and the GaInP etching stop layer 30 are removed from the laminated body 300C, shown in FIG. 5B, by selective etching, respectively, and thereby a laminated body 300D, shown in FIG. 6A, is obtained.

The GaAs substrate 20 and the GaInP etching stop layer 30 may be etched as follows:

The GaAs substrate 20 can be etched, for example, with a mixture of sulfuric acid ($H_2SO_4$), hydrogen peroxide ($H_2O_2$) and water ($H_2O$) as wet etching solution. Since GaInP in the GaInP etching stop layer 30 does not dissolve in the mixture of sulfuric solution, hydrogen peroxide and water, the wet etching process can be stopped by the GaInP etching stop layer 30.

Moreover, the GaInP etching stop layer 30 can be etched, for example, with a mixture of hydrochloric acid (HCl) and water ($H_2O$).

As described above, the laminated body 300D, shown in FIG. 6A, is obtained by removing the GaAs substrate 20 and the GaInP etching stop layer 30 from the laminated body 300C (See FIG. 5B) by selective etching, respectively.

Next, while forming an electrode 50 (upper electrode, See FIG. 1) on the GaAs contact layer 40, an electrode 10 (lower electrode) is formed on the InP substrate 310.

Then, the contact layer 40 (See FIG. 6A) other than a part located immediately below the electrode 50 (See FIG. 1) is removed by using the electrode 50 as a mask, and thereby a contact layer 40A, as shown in FIG. 6B, is formed.

The contact layer 40A can be formed, for example, by etching with a mixture of sulfuric acid ($H_2SO_4$), hydrogen peroxide ($H_2O_2$) and water ($H_2O$) as wet etching solution. Since Al(Ga)InP in the Al(Ga)InP layer 184 does not dissolve in the mixture of sulfuric solution, hydrogen peroxide and water, the wet etching process can be stopped by the Al(Ga)InP layer 184 in the GaInP cell 180.

As described above, the compound-semiconductor photovoltaic cell 300 according to the third embodiment is completed. The compound-semiconductor photovoltaic cell 300 shown in FIG. 6B is identical with the compound-semiconductor photovoltaic cell 300 shown in FIG. 4.

The compound-semiconductor photovoltaic cell 300 has a configuration in which solar light enters the compound-semiconductor photovoltaic cell 300 from a side of a cell of a wide band gap (side of the GaInP cell 180). Meanwhile, an antireflection film is preferably provided on a surface of the Al(Ga)InP layer 184, which solar light enters. The antireflection film is omitted in FIG. 6B.

As described above, in the third embodiment, a triple-junction compound-semiconductor photovoltaic cell 300, in which a resistance value of the tunnel junction layer 170 decreases, energy loss is reduced, and thereby efficiency is enhanced, and a manufacturing method of the compound-semiconductor photovoltaic cell 300 can be provided.

Moreover, a carrier concentration (doping concentration) may be lower compared with the case where an energy difference between a valence band of a $p^+$-layer and a conduction band of an $n^+$-layer is great, and a tunnel junction can be formed easily.

Therefore, according to the third embodiment, a compound-semiconductor photovoltaic cell 300, efficiency of which is enhanced, and a manufacturing method of the compound-semiconductor photovoltaic cell 300 can be provided.

Regarding a triple-junction photovoltaic cell 300, such as the compound-semiconductor photovoltaic cell 300 according to the third embodiment, for example, Oyo Butsuri Vol. 79 No. 5, 2010, p. 436 describes, as band gaps of three cells, a combination of 1.9 eV/1.42 eV/1.0 eV and a combination of 1.7 eV/1.2 eV/0.67 eV, which are more preferable than the triple-junction cell of (1.88 eV/1.4 eV/0.67 eV) according to the related art.

However, it is quite difficult to realize the combinations of band gaps by using a lattice constant.

In this respect, according to the third embodiment, since a compound-semiconductor photovoltaic cell 300 is manufactured by joining two cells of lattice constants (laminated body 300A and laminated body 300B (See FIG. 5A)) using a direct junction method, the compound-semiconductor photovoltaic cell 300 including cells having lattice constants which are different from each other can be easily realized.

Meanwhile, in the above description, the embodiment, in which respective cells or the like are formed on an InP substrate 310 and a GaAs substrate 20 by MOCVD method, is explained. However, the respective cells or the like may be formed by MBE (Molecular Beam Epitaxy) method.

Moreover, in the above description, the embodiment, in which the compound-semiconductor photovoltaic cell 300 is manufactured by using laminated bodies 300B and 300A, using the InP substrate 310 and the GaAs substrate 20, respectively, is explained. However, a combination other than the InP substrate 310 and the GaAs substrate 20 may be used.

For example, the laminated bodies 300B and 300A may be manufactured similarly by a combination of a Ge substrate and an InP substrate, a combination of a gallium antimonide (GaSb) substrate and a GaAs substrate, a combination of GaSb substrate and a Ge substrate, a combination of a Si substrate and a Ge substrate, a combination of as Si substrate and a GaAs substrate or the like.

Moreover, in the above description, the embodiment, in which the laminated bodies 300A and 300B are joined directly, is explained. However, they may be joined mechanically.

Moreover, in the above description, the embodiment, in which as an InP lattice matching system material cell a GaInPAs cell 120 is used, is explained. However, the InP lattice matching system material cell is not limited to the GaInPAs cell 120, but a cell expressed by GaIn(P)As may be used.

The notation (P) in the expression GaIn(P)As represents both a composition including P and a composition not including P. That is, GaIn(P)As is an expression including both GaInPAs and GaInAs. Therefore, a GaInAs cell may be used instead of the GaInPAs cell 120.

Moreover, in the above description, the embodiment, in which as a GaAs lattice matching system material cell a GaInP cell 180 is used, is explained. However, the GaAs lattice matching system material cell is not limited to the GaInP cell 180, by a cell expressed by (Al)GaInP(As) may be used.

The expression (Al)GaInP(As) includes both a composition including Al and a composition not including Al. Moreover, the expression (Al)GaInP(As) includes both a composition including As and a composition not including As. For this reason, it is expressed by "(Al)" and "(As)". That is, "(Al)GaInP(As)" is an expression including AlGaInPAs, AlGaInP, GaInPAs and GaInP. Therefore, an AlGaInP cell, a GaInPAs cell or an AlGaInPAs may be used instead of the GaInP cell 180.

Example 4

In the third embodiment, a triple-junction compound-semiconductor photovoltaic cell 300 made of a GaInP cell 180, a GaAs cell 160 and a GaInPAs cell 120 is manufactured. A combination of band gaps of three photoelectric conversion cells is 1.9 eV/1.42 eV/1.0 eV.

In a fourth embodiment, by adding a GaInAs cell (0.75 eV) to the GaInP cell 180, the GaAs cell 160 and the GaInPAs cell 120 a four-junction compound-semiconductor photovoltaic cell is provided. A combination of band gaps of the four photoelectric conversion cells are 1.9 eV/1.42 eV/1.0 eV/0.75 eV.

FIG. 7 is a cross-sectional diagram illustrating a compound-semiconductor photovoltaic cell 400 according to the fourth embodiment. In the following, to the same composition element as in the compound-semiconductor photovoltaic cell 300 according to the third embodiment, the same reference numeral is assigned, and an explanation thereof will be omitted.

The compound-semiconductor photovoltaic cell 400 includes an electrode 10, an InP substrate 310, a GaInAs cell 410, a tunnel junction layer 220, a GaInPAs cell 120, a junction layer 130, a tunnel junction layer 150A, a GaAs cell 160, a tunnel junction layer 170, a GaInP cell 180, a contact layer 40A and an electrode 50. Meanwhile, the GaInAs cell 410 is an InP-based photoelectric conversion cell.

Here, the GaInP cell 180 is an example of a first photoelectric conversion cell. The GaAs cell 160 is an example of a second photoelectric conversion cell. The GaInAs cell 410 and the GaInPAs cell 120 are examples of plural third photoelectric conversion cells. The InP substrate 310 is an example of a second compound-semiconductor substrate.

The compound-semiconductor photovoltaic cell 400 according to the fourth embodiment is a four-junction photovoltaic cell in which the GaInAs cell 410 (0.75 eV), the GaInPAs cell 120 (1.0 eV), the GaAs cell 160 (1.42 eV) and the GaInP cell 180 (1.9 eV) are connected in series.

In FIG. 7, an incident direction of light is a direction from an upper part to a lower part in the drawing (direction from the GaInP cell 180 to the GaInAs cell 410).

Non-Patent Document 2 describes that a band gap balance of a combination of about 1.9 eV/1.4 eV/1.0 eV/0.7 eV is preferable in a four-junction photovoltaic cell.

The compound-semiconductor photovoltaic cell 400 has a configuration obtained by inserting the GaInAs cell 410 and the tunnel junction layer 220 between the substrate 310 and the GaInPAs cell 120 in the compound-semiconductor photovoltaic cell 300 according to the third embodiment.

The GaInAs cell 410 includes a p-type InP layer 411, a p-type GaInAs layer 412, an n-type GaInAs layer 413 and an n-type InP layer 414. The InP layer 411 is a BSF layer, and the InP layer 414 is a window layer.

Here, the GaInAs cell 410 may be regarded as a cell, which is made of the p-type GaInAs layer 412 and the n-type GaInAs layer 413, without including the InP layer 411 and the InP layer 414. In this case, it may be treated assuming that the InP layer 414 (window layer) is formed on the light incident side of the GaInAs cell 410 which is made of the p-type GaInAs layer 412 and the n-type GaInAs layer 413, and assuming that the InP layer 411 (BSF layer) is formed on the deep side in the light incident direction.

A band gap between the p-type GaInAs layer 412 and n-type GaInAs layer 413 is 0.75 eV.

The expression "GaInAs" of the GaInAs layer 412 represents specifically $Ga_xIn_{1-x}As$ (0<x<1). However, in the following the simplified expression "GaInAs" will be used. The above-described expression is also used for the GaInAs layer 413. However, a value of x of the GaInAs layer 412 may be different from that of the GaInAs layer 413.

The tunnel junction layer 220 is formed between the GaInPAs cell 120 and the GaInAs cell 410. The tunnel junction layer 220 includes an $n^+$-type InP layer 221 and a $p^+$-type Al(Ga)InAs layer 222.

For impurity in the InP layer 221, for example, silicon (Si) may be used so that the conductivity type is $n^+$-type. For impurity in the Al(Ga)InAs layer 222, for example, carbon (C) may be used so that the conductivity type is $p^+$-type. The n+-type InP layer 221 and the p+-type Al(Ga)InAs layer 222 configure a thin p-n junction which is doped at high concentration.

Both the InP layer 221 of the tunnel junction layer 220 and the Al(Ga)InAs layer 222 are doped at higher concentration than the GaInPAs cell 120. The tunnel junction layer 220 is a junction layer arranged so that electric current flows between the p-type GaIn(P)As layer 122 of the GaInPAs cell 120 and the n-type GaInAs layer 413 of the GaInAs cell 410 by tunnel junction.

The expression "Al(Ga)InAs" of the Al(Ga)InAs layer 222 represents specifically $(Al_xGa_{1-x})_yIn_{1-y}As$ (0<x≤1, 0<y<1). However, in the following the simplified expression "Al(Ga)InAs" will be used. Furthermore, the notation "(Ga)" covers the case of including Ga and the case of not including Ga.

The compound-semiconductor photovoltaic cell 400 according to the fourth embodiment has a combination of band gaps of 1.9 eV/1.42 eV/1.0 eV/0.75 eV according to four photoelectric conversion cells of the GaInP cell 180, the GaAs cell 160, the GaInPAs cell 120 and the GaInAs cell 410.

As described above, in the fourth embodiment, a four-junction compound-semiconductor photovoltaic cell 400, in which a resistance value of the tunnel junction layer 170 decreases, energy loss is reduced, and thereby efficiency is high, and a manufacturing method of the compound-semiconductor photovoltaic cell 400 can be provided.

Moreover, a carrier concentration (doping concentration) may be lower compared with the case where an energy difference between a valence band of a p+-layer and a conduction band of an n+-layer is great, and a tunnel junction can be formed easily.

For this reason, according to the fourth embodiment, the compound-semiconductor photovoltaic cell 400 in which energy conversion efficiency can be further improved compared with the compound-semiconductor photovoltaic cell 300 according to the third embodiment is provided.

In the following, variations of the fourth embodiment will be explained with reference to FIGS. 8 to 14.

FIG. 8 is a diagram illustrating a compound-semiconductor photovoltaic cell 400A according to a first variation of the fourth embodiment.

The compound-semiconductor photovoltaic cell 400A according to the first variation of the fourth embodiment is obtained by replacing the tunnel junction layer 170 in the compound-semiconductor photovoltaic cell 400 shown in FIG. 7 by a tunnel junction layer 170A.

The tunnel junction layer 170A includes an n+-type (Al)GaInP layer 171A lattice matching with GaAs, an n+-type (Al)GaInP layer 171B having a compression strain, and a p+-type (Al)GaAs layer 172.

The n+-type (Al)GaInP layer 171B having a compression strain is similar to the n+-type (Al)GaInP layer 171 having a compression strain, which is shown in FIG. 7.

That is, the expression "(Al)GaInP" of the (Al)GaInP layer 171B represents specifically $(Al_{x2}Ga_{1-x2})_{y2}In_{1-y2}P$ (0≤x2<1, 0<y2<1). However, in the following the simplified expression "(Al)GaInP" will be used. Furthermore, the notation "(Al)" covers the case of including Al and the case of not including Al.

A lattice constant of the (Al)GaInP layer 171A is less than a lattice constant of the (Al)GaInP layer 171B, and approximately the same as the lattice constant of GaAs. Since the (Al)GaInP layer 171A is arranged closer to a side of the GaAs cell 160 than the (Al)GaInP layer 171B, the (Al)GaInP layer 171A is formed so as to have a lattice constant lattice matching with GaAs.

The expression "(Al)GaInP" of the (Al)GaInP layer 171A represents specifically $(Al_{x1}Ga_{1-x1})_{y1}In_{1-y1}P$ (0≤x1<1, 0<y1<1). However, in the following the simplified expression "(Al)GaInP" will be used. Furthermore, the notation "(Al)" covers the case of including Al and the case of not including Al.

The (Al)GaInP layer 171A is an example of a second n-type (Al)GaInP layer, the (Al)GaInP layer 171B is an example of a first n-type (Al)GaInP layer. Meanwhile, since an In composition and an Al composition of the (Al)GaInP layer 171B are greater than those of the (Al)GaInP layer 171A, respectively, x2 is greater than x1 (x2>x1) and y2 is smaller than y1 (y2<y1).

FIG. 9 illustrates a band structure of the tunnel junction layer 170A.

By causing the n+-layer (171A, 171B) to have a two-layered configuration, the (Al)GaInP layer 171B having a compression strain can be thinner than the (Al)GaInP layer 171 shown in FIG. 7, and can be formed without generating a lattice relaxation even for a greater strain.

For example, a thickness of the (Al)GaInP layer 171B is 5 nm, and preferably less than or equal to 10 nm. Moreover, a thickness of the (Al)GaInP layer 171A may be set to about 15 nm to 50 nm.

By making a compression strain of the (Al)GaInP layer 171B greater than a compression strain of the (Al)GaInP layer 171, shown in FIG. 7, a band structure is changed as shown in FIG. 9. An energy difference E4 between a valence band of the p+-type (Al)GaAs layer 172 and a conduction band of the n+-type (Al)GaInP layer 171B is less than the energy difference E3, which is shown in FIG. 2D.

Therefore, according to the first variation of the fourth embodiment, a compound-semiconductor photovoltaic cell 400A, in which a resistance value the tunnel junction layer 170A further decreases, energy loss is further reduced and efficiency becomes further higher, can be provided.

Moreover, the first variation of the fourth embodiment may be varied as follows.

FIG. 10 is a diagram illustrating a compound-semiconductor photovoltaic cell 400B according to a second variation of the fourth embodiment.

In the (Al)GaInP layer 171B $((Al_{x2}Ga_{1-x2})_{y2}In_{1-y2}P)$ according to the first variation of the fourth embodiment, shown in FIG. 8, by setting the value of x2 to zero (x2=0), a $Ga_{y2}In_{1-y2}P$ layer 171B1 having a compression strain may be used. The n+-type (Al)GaInP layer 171A, the $Ga_{y2}In_{1-y2}P$ layer 171B1, and the p+-type (Al)GaAs layer 172 configure a tunnel junction layer 170A1.

A band gap of the $Ga_{y2}In_{1-y2}P$ layer having a compression strain is less than the absorption (GaInP) layers 182, 183 of the GaInP cell 180, and a part of light passing through the GaInP cell 180 may be absorbed. However, in the second variation of the fourth embodiment, since the p+-layer for tunnel junction is formed by two layers with $(Al_{x1}Ga_{1-x1})_{y1}In_{1-y1}P$ layer 171A, it may be thinner than the case where the p+-layer for tunnel junction is formed by one layer, for example, about 5 nm. Accordingly, while suppressing an influence of absorption, tunneling probability can be increased, since the conduction band is at a lower position by not including Al.

FIG. 11 is a diagram illustrating a compound-semiconductor photovoltaic cell 400C according to a third variation of the fourth embodiment.

The compound-semiconductor photovoltaic cell 400C according to the third variation of the fourth embodiment is obtained by replacing the tunnel junction layer 170 in the compound semiconductor photovoltaic cell 400 shown in FIG. 7 by a tunnel junction layer 170B.

The tunnel junction layer 170B includes an n⁺-type (Al)GaInP layer 171 having a compression strain, a p⁺-type (Al)GaAs layer 172A, and a p⁺-type (Al)GaAs layer 172B.

The expression "(Al)GaAs" of the (Al)GaAs layer 172A represents specifically $Al_{x3}Ga_{1-x3}As$ (0≤x3<1). However, in the following the simplified expression "(Al)GaAs" will be used. Moreover, the notation "(Al)" covers the case of including Al and the case of not including Al.

The expression "(Al)GaAs" of the (Al)GaAs layer 172B represents specifically $Al_{x4}Ga_{1-x4}As$ (0≤x4<1). However, in the following the simplified expression "(Al)GaAs" will be used. Moreover, the notation "(Al)" covers the case of including Al and the case of not including Al.

The p⁺-type (Al)GaAs layer 172A is similar to the p⁺-type (Al)GaAs layer 172, which is shown in FIG. 7.

The (Al)GaAs layer 172A has a configuration in which an Al composition is less than the (Al)GaAs layer 172B. That is, x4 is greater than x3 (x4>x3).

The (Al)GaAs layer 172A is an example of a first p-type (Al)Ga(In)As layer, and the (Al)GaAs layer 172B is an example of a second p-type (Al)Ga(In)As layer.

The expression "(Al)Ga(In)As" represents specifically $(Al_xGa_{1-x})_yIn_{1-y}As$ (0≤x<1, 0<y≤1). However, in the following the simplified expression "(Al)Ga(In)As" will be used. Moreover, the notation "(Al)" covers the case of including Al and the case of not including Al, and the notation "(In)" covers the case of including In and the case of not including In.

The (Al)GaAs layer 172B preferably has a band gap the same as or greater than the GaInP cell 180 on the light incident side. In order to cause a carrier to tunnel more easily, it is necessary to increase an energy of a valence band of a p-layer in the tunnel junction layer 170B.

Then, the (Al)GaAs layer 172A, which has an Al composition less than the (Al)GaAs layer 172B, is provided on the side of the (Al)GaInP layer 171.

FIG. 12 is a diagram illustrating a band structure of the tunnel junction layer 170B.

Upon an Al composition of (Al)GaAs ($Al_xGa_{1-x}As$ (0≤x<1)) decreasing, an energy of a conduction band decreases, and an energy of a valence band increases.

Accordingly, by providing the (Al)GaAs layer 172B and the (Al)GaAs layer 172A, which has the less Al composition, as shown in FIG. 12, the energy of the valence band of the (Al)GaAs layer 172A can be increased while decreasing the energy of the conduction band.

As a result, an energy difference E5 between the valence band of the (Al)GaAs layer 172A and the conduction band of the (Al)GaInP layer 171 becomes smaller than the energy difference E3, shown in FIG. 2D.

Moreover, the (Al)GaAs layer 172A, having an Al composition, which is less than the (Al)GaAs layer 172B, has a band gap which is less than the (Al)GaAs layer 172B. Therefore, by making a thickness of the (Al)GaAs layer 172A less than the (Al)GaAs layer 172B, light absorption at the (Al)GaAs layer 172A can be reduced. The thickness of the (Al)GaAs layer 172A may be, for example, about 5 nm, and is preferably less than or equal to 10 nm.

Moreover, a thickness of the (Al)GaAs layer 172B may be set, for example, greater than or equal to 15 nm but less than or equal to 50 nm.

Therefore, according to the third variation of the fourth embodiment, a compound-semiconductor photovoltaic cell 400C, in which a resistance value of the tunnel junction layer 170B further decreases, energy loss is further reduced and efficiency becomes further higher, can be provided.

FIG. 13 is a diagram illustrating a compound-semiconductor photovoltaic cell 400D according to a fourth variation of the fourth embodiment.

The compound-semiconductor photovoltaic cell 400D includes a tunnel junction layer 170C having a configuration in which the tunnel junction layer 170A of the compound-semiconductor photovoltaic cell 400A shown in FIG. 8 and the tunnel junction layer 170B of the compound-semiconductor photovoltaic cell 400C shown in FIG. 10 are joined.

The tunnel junction layer 170C includes an n⁺-type (Al)GaInP layer 171A, an n⁺-type (Al)GaInP layer 171B having a compression strain, a p⁺-type (Al)GaAs layer 172A and a p⁺-type (Al)GaAs layer 172B.

FIG. 14 is a diagram illustrating a band structure of the tunnel junction layer 170C.

An energy difference E6, between a conduction band of the n⁺-type (Al)GaInP layer 171B and a valence band of the p⁺-type (Al)GaAs layer 172A, is less than the energy difference E4 in the tunnel junction layer 170A and less than the energy difference E5 in the tunnel junction layer 170B.

Therefore, according to the fourth variation of the fourth embodiment, a compound-semiconductor photovoltaic cell 400D, in which a resistance value of the tunnel junction layer 170C further decreases, energy loss is further reduced and efficiency becomes further higher, can be provided.

Example 5

FIG. 15 is a cross-sectional diagram illustrating a compound-semiconductor photovoltaic cell 500 according to a fifth embodiment. In the following, to the same composition element as in the compound-semiconductor photovoltaic cell 400 according to the fourth embodiment, the same reference numeral is assigned, and an explanation thereof will be omitted.

The compound-semiconductor photovoltaic cell 500 includes an electrode 10, an InP substrate 310, a GaInAs cell 410, a tunnel junction layer 220, a GaInPAs cell 520, a junction layer 130, a tunnel junction layer 150A and a GaInAs cell 560.

The compound-semiconductor photovoltaic cell 500 further includes a tunnel junction layer 170, an AlGaAs cell 570, a tunnel junction layer 580, an AlGaInP cell 590, a contact layer 40A and an electrode 50.

The compound-semiconductor photovoltaic cell 500 according to the fifth embodiment is a five-junction photovoltaic cell in which the GaInAs cell 410 (0.75 eV), the GaInPAs cell 520 (1.06 eV), the GaInAs cell 560 (1.4 eV), the AlGaAs cell 570 (1.68 eV) and the AlGaInP cell 590 (2.17 eV) are connected in series.

A band gap of the AlGaInP cell 590 (2.17 eV) is greater than the band gap of the GaInP cell 180 (1.9 eV) according to the fourth embodiment.

Here, the AlGaInP cell 590, the AlGaAs cell 570 and the GaInAs cell 560 are examples of a first photoelectric conversion cell, a second photoelectric conversion cell and a third photoelectric conversion cell, respectively.

Moreover, the GaInAs cell 410 and the GaInPAs cell 520 are examples of plural fourth photoelectric conversion cells.

The compound-semiconductor photovoltaic cell 500 is prepared by joining a first laminated body including the junction layer 130 and a second laminated body including the tunnel junction layer 150A.

The first laminated body includes the electrode 10, the InP substrate 310, the GaInAs cell 410, the tunnel junction layer 220, the GaInPAs cell 520 and the junction layer 130. Moreover, the second laminated body includes the tunnel junction layer 150A, the GaInAs cell 560, the tunnel junction layer 170, the AlGaAs cell 570, the tunnel junction layer 580, the AlGaInP cell 590, the contact layer 40A and the electrode 50.

The GaInPAs cell 520 includes a p-type InP layer 121, a p-type GaIn(P)As layer 122, an n-type GaIn(P)As layer 123 and an n-type Al(Ga)InAs layer 524. The Al(Ga)InAs layer 524 is a window layer.

The expression "Al(Ga)InAs" of the Al(Ga)InAs layer 524 represents specifically $(Al_xGa_{1-x})_yIn_{1-y}As$ ($0<x\leq1$, $0<y<1$). However, in the following the simplified expression "Al(Ga)InAs" will be used. Moreover, the notation "(Ga)" covers the case of including Ga and the case of not including Ga.

The GaInAs cell 560 includes a p-type GaInP layer 161, a p-type Ga(In)As layer 562, an n-type Ga(In)As layer 563 and an n-type (Al)GaInP layer 164.

The expression "Ga(In)As" of the Ga(In)As layer 562 represents specifically $Ga_xIn_{1-x}As$ ($0<x\leq1$). However, in the following the simplified expression "Ga(In)As" will be used. The notation "(In)" represents both a composition including In and a composition not including In. The above-described expression is also used for the Ga(In)As layer 563. However, a value of x of the Ga(In)As layer 562 may be different from that of the Ga(In)As layer 563.

The AlGaAs cell 570 includes a p-type (Al)GaInP layer 571, a p-type (Al)GaAs layer 572, an n-type (Al)GaAs layer 573 and an n-type (Al)GaInP layer 574.

The expression "(Al)GaInP" of the (Al)GaInP layer 571 represents specifically $(Al_xGa_{1-x})_yIn_{1-y}P$ ($0\leq x<1$, $0<y<1$). However, in the following the simplified expression "(Al)GaInP" will be used. Moreover, the notation "(Al)" covers the case of including Al and the case of not including Al. The above-described expression is also used for the (Al)GaInP layer 574. Values of x and y of the (Al)GaInP layer 571 may be different from those of the (Al)GaInP layer 574.

The expression "(Al)GaAs" of the (Al)GaAs layer 572 represents specifically $Al_xGa_{1-x}As$ ($0\leq x<1$). However, in the following the simplified expression "(Al)GaAs" will be used. Meanwhile, the above-described expression is also used for the (Al)GaAs layer 573. However, a value of x of the (Al)GaAs layer 572 may be different from that of the (Al)GaAs layer 573.

The AlGaInP cell 590 includes a p-type Al(Ga)InP layer 591, a p-type (Al)GaInP layer 592, an n-type (Al)GaInP layer 593 and an n-type Al(Ga)InP layer 594.

The expression "Al(Ga)InP" of the Al(Ga)InP layer 591 represents specifically $(Al_xGa_{1-x})_yIn_{1-y}P$ ($0\leq x\leq1$, $0<y\leq1$). However, in the following the simplified expression "Al(Ga)InP" will be used. Meanwhile, the above-described expression is also used for the Al(Ga)InP layer 594. However, a value of x of the Al(Ga)InP layer 591 may be different from that of the Al(Ga)InP layer 594.

The expression "(Al)GaInP" of the (Al)GaInP layer 592 represents specifically $(Al, Ga_{1-x})_yIn_{1-y}P$ ($0\leq x<1$, $0<y<1$). However, in the following the simplified expression "(Al)GaInP" will be used. Moreover, the notation "(Al)" covers the case of including Al and the case of not including Al. The above-described expression is also used for the (Al)GaInP layer 593. Values of x and y of the (Al)GaInP layer 592 may be different from those of the (Al)GaInP layer 593.

Meanwhile, the (Al)GaInP layer 592 and the (Al)GaInP layer 593 may include As. That is, the AlGaInP cell 590 may be formed to include an absorption layer expressed by "AlGaInP(As)". The notation "(As)" represents both a composition including As and a composition not including As. A small amount of As may be added to the (Al)GaInP layer 592 and the (Al)GaInP layer 593.

The tunnel junction layer 580, as in the tunnel junction layer 170, includes an n-type (Al)GaInP layer 581 and a p⁺-type (Al)GaAs layer 582.

The expression "(Al)GaInP" of the (Al)GaInP layer 581 represents specifically $(Al, Ga_{1-y})_yIn_{1-y}P$ ($0\leq x<1$, $0<y<1$). However, in the following the simplified expression "(Al)GaInP" will be used. Moreover, the notation "(Al)" covers the case of including Al and the case of not including Al. Meanwhile, the expression "(Al)GaAs" of the (Al)GaAs layer 582 represents specifically $Al_xGa_{1-x}As$. However, in the following the simplified expression "(Al)GaAs" will be used. The notation "(Al)" covers the case of including Al and the case of not including Al.

A lattice constant of the (Al)GaInP layer 581 is greater than the lattice constant of GaAs. Moreover, the (Al)GaAs layer 582 almost lattice matches with GaAs. Therefore, the (Al)GaInP layer 581 laminated on the (Al)GaAs layer 582 has a lattice strain. A total thickness of the (Al)GaInP layer 581 and the (Al)GaAs layer 582 is, for example, greater than or equal to 25 nm but less than or equal to 50 nm.

The (Al)GaInP layer 581 and the (Al)GaAs layer 582 are similar to the (Al)GaInP layer 171 and the (Al)GaAs layer 172, respectively. However, in order to suppress absorption of light passing through the AlGaInP cell 590 having a band gap of 2.17 eV, band gaps are made wide so as to correspond to the AlGaInP cell 590.

In FIG. 15, an incident direction of light is a direction from an upper part to a lower part in the drawing (direction from the AlGaInP cell 590 to the GaInAs cell 410).

In general, the greater a band gap of a material is, the more difficult to increase electric current density of a tunnel current is. This is because in a case of using the p⁺-(Al)GaAs layer and the n⁺-(Al)GaInP layer, upon increasing an Al composition in the p⁺-(Al)GaAs layer and increasing an Al composition in the n⁺-(Al)GaInP layer, an energy difference between a valence band of a p-type layer and a conduction band of an n-type layer increases.

In the fifth embodiment, since the tunnel junction layer 170 and the tunnel junction layer 580 are p-n junctions including p⁺-(Al)GaAs and an n⁺-type (Al)GaInP layer having a pressure strain, the energy difference between the valence band of the p-type layer and the conduction band of the n-type layer can be made smaller.

Therefore, even in a tunnel junction using a material having a greater band gap, a resistance value can be reduced. For example, in the case of a multi-junction photovoltaic cell of five or more junctions, as in the fifth embodiment, from balance of band gaps of respective cells, it is necessary to include a cell, for example, of 1.9 eV or more.

Accordingly, in the case of five-junction photovoltaic cell, as in the fifth embodiment, using the tunnel junction layers 170 and 580 is especially effective.

Energy conversion efficiency of the five-junction photovoltaic cell having the combination of 2.17 eV/1.68 eV/1.40 eV/1.06 eV/0.75 eV in the fifth embodiment is greater than the four-junction photovoltaic cell according to the fourth embodiment.

Therefore, according to the fifth embodiment, a compound-semiconductor photovoltaic cell 500 having even higher efficiency can be manufactured.

As described above, according to the fifth embodiment, a five-junction compound-semiconductor photovoltaic cell 500, in which a resistance value of the tunnel junction layers 170 and 580 decrease, energy loss is reduced and efficiency becomes further higher, and a manufacturing method of the compound-semiconductor photovoltaic cell 500 can be provided.

Moreover, a carrier concentration (doping concentration) may be lower compared with the case where an energy difference between a valence band of a p$^+$-layer and a conduction band of an n$^+$-layer is great, and a tunnel junction can be formed easily.

Although the present invention has been described with reference to embodiments, the present invention is not limited to these embodiments, but various variations and modifications may be made without departing from the scope of the invention as set forth in the accompanying claims.

The present application is based on and claims the benefit of priority of Japanese Priority Applications No. 2014-142826 filed on Jul. 11, 2014 and No. 2015-122272 filed on Jun. 17, 2015, the entire contents of which are hereby incorporated by reference.

INDUSTRIAL APPLICABILITY

The present invention can be applied to a compound-semiconductor photovoltaic cell and a manufacturing method of a compound-semiconductor photovoltaic cell.

REFERENCE SIGNS LIST 10,50 electrode
20,110 GaAs substrate
30 etching stop layer
40,40A contact layer
100,200,300,400,400A,400B,400C,500 compound-semiconductor photovoltaic cell
111,214 GaAs buffer layer
120,520 GaInPAs cell
121,221,411,414 InP layer
122,123 GaIn(P)As layer
124,524 Al(Ga)InAs layer
130 junction layer
150,150A,170,170A, 170B, 170C,220,580 tunnel junction layer
151,152,162,163 GaAs layer
160 GaAs cell
161,182,183 GaInP layer
164,171,571,574,581,592,593 (Al)GaInP layer
172,572,573,582 (Al)GaAs layer
180,280 GaInP cell
181,184 Al(In)P layer
210 Ge cell
211 Ge substrate
212 Ge layer
213 GaInP buffer layer
222 Al(Ga)InAs layer
260,410,560 GaInAs cell
262 Ga(In)As layer
263,412,413,562,563 GaInAs layer
300A,300B,300C,300D laminated body
310 InP substrate
562,563 (Ga)InAs layer
570 AlGaAs cell
590 AlGaInP cell
591,594 (Al)InP layer

The invention claimed is:

1. A compound-semiconductor photovoltaic cell comprising:
a first photoelectric conversion cell made of a first compound-semiconductor material whose lattice matches with gallium arsenide (GaAs) or germanium (Ge);
a first tunnel junction layer arranged on a deep side farther than the first photoelectric conversion cell in a light incident direction, and including at least two layers, the at least two layers including a first positive type (p-type) layer of aluminum gallium indium arsenide $((Al_{x1}Ga_{1-x1})_{y1}In_{1-y1}As$ $(0 \leq x1 < 1, 0 < y1 \leq 1)$ and a first negative type (n-type) layer of aluminum gallium indium phosphide $((Al_{x2}Ga_{1-x2})_{y2}In_{1-y2}P$ $(0 \leq x2 < 1, 0 < y2 \leq 1)$);
a second photoelectric conversion cell arranged on a deep side farther than the first tunnel junction layer in the light incident direction, and made of a second compound-semiconductor material which is a GaAs-based semiconductor material; and
a second n-type aluminum gallium indium phosphide $((Al_{x4}Ga_{1-x4})_{y4}In_{1-y4}P$ $(0 \leq x4 < 1))$ layer, which is formed on a side of the second photoelectric conversion cell of the first n-type $(Al_{x2}Ga_{1-x2})_{y2}In_{1-y2}P$ layer and has a lattice which matches with GaAs or Ge,
wherein the first photoelectric conversion cell and the second photoelectric conversion cell are joined via the first tunnel junction layer, the first p-type layer of $(Al_{x1}Ga_{1-x1})_{y1}In_{1-y1}As$ has a lattice that matches with the first photoelectric conversion cell, the lattice of the first photoelectric conversion cell matching with GaAs or Ge, and a lattice constant of the first n-type layer of $(Al_{x2}Ga_{1-x2})_{y2}In_{1-y2}P$ is greater than the lattice constant of the first photoelectric conversion cell, and
a bandgap of the first n-type layer of $(Al_{x2}Ga_{1-x2})_{y2}In_{1-y2}P$ is the same as or greater than a bandgap of the first photoelectric conversion cell.

2. The compound-semiconductor photovoltaic cell as claimed in claim 1, wherein the first compound-semiconductor material of the first photoelectric conversion cell is aluminum gallium indium phosphide $((Al_{x3}Ga_{1-x3})_{y3}In_{1-y3}P$ $(0 \leq x3 < 1, 0 < y3 \leq 1))$.

3. The compound-semiconductor photovoltaic cell as claimed in claim 1, wherein a band gap of the first photoelectric conversion cell is greater than 1.9 eV (electron Volt).

4. The compound-semiconductor photovoltaic cell as claimed in claim 1, wherein a composition of aluminum (Al) of the second n-type layer of $(Al_{x4}Ga_{1-x4})_{y4}In_{1-y4}P$ is greater than a composition of Al of the first n-type layer of $(Al_{x2}Ga_{1-x2})_{y2}In_{1-y2}P$.

5. The compound-semiconductor photovoltaic cell as claimed in claim 1, wherein the first n-type layer $(Al_{x2}Ga_{1-x2})_{y2}In_{1-y2}P$ is an n-type gallium indium phosphide (GaInP) layer with does not include Al.

6. The compound-semiconductor photovoltaic cell as claimed in claim 1, wherein the first tunnel junction layer further includes a second p-type layer of aluminum gallium indium arsenide $((Al_{x5}Ga_{1-x5})_{y5}In_{1-y5}As$ $(0 < x5 < 1, 0 < y5 \leq 1))$, which is formed on a side of the first photoelectric conversion cell of the first p-type layer of $(Al_{x1}Ga_{1-x1})_{y1}In_{1-y1}As$, and wherein a composition of aluminum (Al) of the second p-type layer $(Al_{x5}Ga_{1-x5})_{y5}In_{1-y5}As$ is greater than a composition of Al of the first p-type layer $(Al_{x1}Ga_{1-x1})_{y1}In_{1-y1}As$.

7. The compound-semiconductor photovoltaic cell as claimed in claim 1, further comprising:

a first junction layer made of a third compound-semiconductor material formed on a deep side of the second photoelectric conversion cell in the light incident direction;

a compound-semiconductor substrate;

one or more third photoelectric conversion cells, each made of a fourth compound-semiconductor material and laminated on the compound-semiconductor substrate; and a second junction layer made of a fifth compound-semiconductor material and laminated on the one or more third photoelectric conversion cells, wherein a surface of the first junction layer opposite to a surface connected to the second photoelectric conversion cell and a surface of the second junction layer opposite to a surface connected to the third photoelectric conversion cells are joined.

8. The compound-semiconductor photovoltaic cell as claimed in claim 1, further comprising:

a second tunnel junction layer arranged on a deep side farther than the second photoelectric conversion cell in the light incident direction and including a second p-type layer of $(Al_{x6}Ga_{1-x6})_{y6}In_{1-y6}As$ ($0 \leq x6 < 1$, $0 < y6 \leq 1$) and a second n-type layer $(Al_{x7}Ga_{1-x7})_{y7}In_{1-y7}P$ ($0 \leq x7 < 1$, $0 < y7 < 1$); and a third photoelectric conversion cell arranged on a deep side farther than the second tunnel junction layer in the light incident direction and made of a GaAs-based semiconductor material or a Ge-based semiconductor material, wherein the second photoelectric conversion cell and the third photoelectric conversion cell are joined via the second tunnel junction layer, a band gap of the third photoelectric conversion cell is less than a band gap of the second photoelectric conversion cell, and a lattice constant of the second n-type layer $(Al_{x7}Ga_{1-x7})_{y7}In_{1-y7}P$ is greater than a lattice constant of the second photoelectric conversion cell.

9. The compound-semiconductor photovoltaic cell as claimed in claim 8, further comprising:

a first junction layer made of a third compound-semiconductor material formed on a deep side of the third photoelectric conversion cell in the light incident direction;

a compound-semiconductor substrate;

one or more fourth photoelectric conversion cells, each made of a fourth compound-semiconductor material and laminated on the compound-semiconductor substrate;

a second junction layer made of fifth compound-semiconductor material and laminated on the one or more fourth photoelectric conversion cells, wherein a surface of the first junction layer opposite to a surface connected to the third photoelectric conversion cell and a surface of the second junction layer opposite to a surface connected to the fourth photoelectric conversion cells are joined.

10. The compound-semiconductor photovoltaic cell as claimed in claim 7 wherein the compound-semiconductor substrate is an indium phosphide (InP) substrate.

11. The compound-semiconductor photovoltaic cell as claimed in claim 9, wherein at least five photoelectric conversion cells are connected in a lamination direction by the first photoelectric conversion cell, the second photoelectric conversion cell, the third photoelectric conversion cell and the fourth photoelectric conversion cells including two cells to form a multi-junction cell.

12. The compound-semiconductor photovoltaic cell according to claim 1, wherein the lattice constant of the first n-type layer of $(Al_{x2}Ga_{1-x2})_{y2}In_{1-y2}P$ is equal to a lattice constant of the second photoelectric conversion cell.

13. The compound-semiconductor photovoltaic cell according to claim 1, wherein the first p-type layer of $(Al_{x1}Ga_{1-x1})_{y1}In_{1-y1}As$ and the first photoelectric conversion cell have a same lattice constant.

14. The compound-semiconductor photovoltaic cell according to claim 1, wherein the first p-type layer of $(Al_{x1}Ga_{1-x1})_{y1}In_{1-y1}As$ and the second photoelectric conversion cell have a same lattice constant.

15. The compound-semiconductor photovoltaic cell according to claim 1, wherein $0 < x2 < 1$ in the first n-type layer of $(Al_{x2}Ga_{1-x2})_{y2}In_{1-y2}P$.

16. The compound-semiconductor photovoltaic cell according to claim 1, wherein a bandgap of the first p-type layer of $(Al_{x1}Ga_{1-x1})_{y1}In_{1-y1}As$ is the same as or greater than the bandgap of the first photoelectric conversion cell.

* * * * *